United States Patent
Xie et al.

(10) Patent No.: US 11,948,944 B2
(45) Date of Patent: Apr. 2, 2024

(54) OPTIMIZED CONTACT RESISTANCE FOR STACKED FET DEVICES

(71) Applicant: International Business Machines Corporation, Armonk, NY (US)

(72) Inventors: Ruilong Xie, Niskayuna, NY (US); Heng Wu, Guilderland, NY (US); Jingyun Zhang, Albany, NY (US); Julien Frougier, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 172 days.

(21) Appl. No.: 17/404,628

(22) Filed: Aug. 17, 2021

(65) Prior Publication Data
US 2023/0054540 A1    Feb. 23, 2023

(51) Int. Cl.
| | |
|---|---|
| *H01L 27/12* | (2006.01) |
| *H01L 21/822* | (2006.01) |
| *H01L 21/8234* | (2006.01) |
| *H01L 23/522* | (2006.01) |

(52) U.S. Cl.
CPC ...... *H01L 27/1207* (2013.01); *H01L 21/8221* (2013.01); *H01L 21/823475* (2013.01); *H01L 23/5226* (2013.01); *H01L 27/1211* (2013.01)

(58) Field of Classification Search
CPC ............ H01L 27/1207; H01L 27/1211; H01L 21/8221; H01L 21/823475; H01L 23/5226
USPC ........................................................ 257/401
See application file for complete search history.

(56) References Cited

U.S. PATENT DOCUMENTS

| | | |
|---|---|---|
| 5,612,563 A | 3/1997 | Fitch et al. |
| 7,855,403 B2 | 12/2010 | Bertin et al. |
| 7,855,455 B2 | 12/2010 | Purushothaman et al. |
| 8,093,099 B2 | 1/2012 | Purushothaman et al. |
| 8,853,785 B2 | 10/2014 | Augendre et al. |
| 9,064,717 B2 | 6/2015 | Purushothaman et al. |
| 9,064,849 B2 | 6/2015 | Zhu |

(Continued)

FOREIGN PATENT DOCUMENTS

EP    0562207 A1    9/1993

OTHER PUBLICATIONS

Hsieh et al., "Monolithic 3D BEOL FinFET switch arrays using location-controlled-grain technique in voltage regulator with better FOM than 2D regulators," 2019 IEEE International Electron Devices Meeting (IEDM) (Dec. 2019) (4 pages).
Oota et al., "3D-Stacked CAAC-In—Ga—Zn Oxide FETs with Gate Length of 72nm," 2019 IEEE International Electron Devices Meeting (IEDM) (Dec. 2019) (4 pages).

(Continued)

*Primary Examiner* — Tu-Tu V Ho
(74) *Attorney, Agent, or Firm* — Steven M. Bouknight

(57) ABSTRACT

Stacked FET devices having wrap-around contacts to optimize contact resistance and techniques for formation thereof are provided. In one aspect, a stacked FET device includes: a bottom-level FET(s) on a substrate; lower contact vias present in an ILD disposed over the bottom-level FET(s); a top-level FET(s) present over the lower contact vias; and top-level FET source/drain contacts that wrap-around source/drain regions of the top-level FET(s), wherein the lower contact vias connect the top-level FET source/drain contacts to source/drain regions of the bottom-level FET(s). When not vertically aligned, a local interconnect can be used to connect a given one of the lower contact vias to a given one of the top-level FET source/drain contacts. A method of forming a stacked FET device is also provided.

14 Claims, 25 Drawing Sheets

(56) References Cited

U.S. PATENT DOCUMENTS

| | | | |
|---|---|---|---|
| 9,202,808 B2 * | 12/2015 | Stockinger | H01L 29/4238 |
| 9,287,134 B2 | 3/2016 | Wang et al. | |
| 9,837,414 B1 | 12/2017 | Balakrishnan et al. | |
| 9,997,463 B2 | 6/2018 | Zhang | |
| 10,043,781 B2 | 8/2018 | Sekar et al. | |
| 10,090,193 B1 | 10/2018 | Chanemougame et al. | |
| 10,217,674 B1 | 2/2019 | Hook et al. | |
| 2018/0190619 A1 | 7/2018 | Sekar et al. | |
| 2020/0006329 A1 | 1/2020 | Lilak et al. | |
| 2020/0126987 A1 | 4/2020 | Rubin et al. | |
| 2020/0273779 A1 | 8/2020 | Lilak et al. | |
| 2020/0343241 A1 | 10/2020 | Wu et al. | |
| 2021/0074730 A1 | 3/2021 | Stamper et al. | |

OTHER PUBLICATIONS

Hsueh et al., "Monolithic 3D SRAM-CIM Macro Fabricated with BEOL Gate-All-Around MOSFETs," 2019 IEEE International Electron Devices Meeting (IEDM) (Dec. 2019) (4 pages).

P. Sideris et al., "Inter-tier Dynamic Coupling and RF Crosstalk in 3D Sequential Integration," 2019 IEEE International Electron Devices Meeting (IEDM) (Dec. 2019) (4 pages).

Yoo et al., "Highly stacked 3D organic integrated circuits with via-hole-less multilevel metal interconnects," Nature communications, 10(1), pp. 1-9 (Jun. 2019).

International Search Report and Written Opinion for PCT/CN2022/104830 dated Sep. 23, 2022 (9 pages).

* cited by examiner

X-X'

Y-Y'

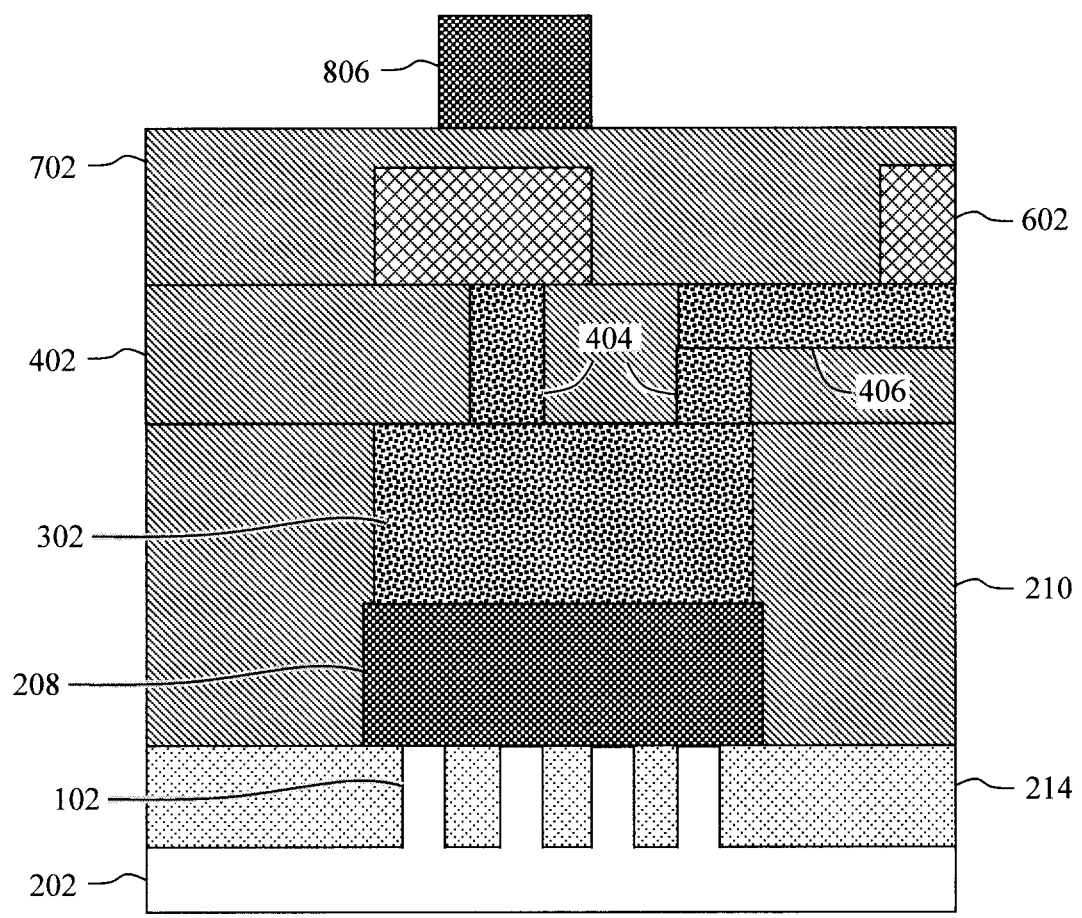
Y-Y'  FIG. 8B

OPTIMIZED CONTACT RESISTANCE FOR STACKED FET DEVICES

FIELD OF THE INVENTION

The present invention relates to stacked field-effect transistor (FET) devices, and more particularly, to stacked FET devices having wrap-around contacts to optimize contact resistance and techniques for formation thereof.

BACKGROUND OF THE INVENTION

Stacking can be employed to reduce the footprint area of a field-effect transistor (FET) device. With a stacked device design, at least one FET is placed vertically on top of at least one other, complementary FET. For instance, a p-channel FET (PFET) can be stacked on top of an n-channel FET (NFET), or vice versa.

However, stacking FET devices in this manner requires cross-level integration, i.e., to connect the bottom-level and top-level devices, which can present some notable challenges. For instance, a common approach to cross-level integration involves accessing both the bottom-level and top-level devices from the top-down. However, since the devices are stacked one over the other, this approach typically involves forming a complex network of interconnects over the devices in order to properly route the connections to each device. Forming these interconnect configurations can increase fabrication complexity and drive-up production costs. Furthermore, accessing device components such as the source/drain regions from the top results in limited contact area, and hence increased contact resistance.

Therefore, improved cross-level integration schemes which can be implemented more easily and efficiently, and which optimize contact resistance, would be desirable.

SUMMARY OF THE INVENTION

The present invention provides stacked field-effect transistor (FET) devices having wrap-around contacts to optimize contact resistance and techniques for formation thereof. In one aspect of the invention, a stacked FET device is provided. The stacked FET device includes: at least one bottom-level FET on a substrate; lower contact vias present in an interlayer dielectric (ILD) disposed over the at least one bottom-level FET; at least one top-level FET present over the lower contact vias; and top-level FET source/drain contacts that wrap-around source/drain regions of the at least one top-level FET, wherein the lower contact vias connect the top-level FET source/drain contacts to source/drain regions of the at least one bottom-level FET.

In another aspect of the invention, another stacked FET device is provided. The stacked FET device includes: at least one bottom-level FET on a substrate; lower contact vias and local interconnects present in an ILD disposed over the at least one bottom-level FET; at least one top-level FET present over the lower contact vias; top-level FET source/drain contacts that wrap-around source/drain regions of the at least one top-level FET, wherein the lower contact vias connect the top-level FET source/drain contacts to source/drain regions of the at least one bottom-level FET, wherein each of the local interconnects connects a given one of the lower contact vias to a given one of the top-level FET source/drain contacts, and wherein each of the top-level FET source/drain contacts is in direct contact with either one of the local interconnects or one of the lower contact vias from a bottom of the at least one top-level FET.

In yet another aspect of the invention, a method of forming a stacked FET device is provided. The method includes forming at least one bottom-level FET on a substrate; depositing an ILD over the at least one bottom-level FET; forming lower contact vias in the ILD that are connected to source/drain regions of the at least one bottom-level FET; forming sacrificial contacts over the lower contact vias; forming at least one top-level FET over the sacrificial contacts; and removing the sacrificial contacts and replacing the sacrificial contacts with top-level FET source/drain contacts that wrap-around source/drain regions of the at least one top-level FET.

A more complete understanding of the present invention, as well as further features and advantages of the present invention, will be obtained by reference to the following detailed description and drawings.

BRIEF DESCRIPTION OF THE DRAWINGS

FIG. 8B is a Y-Y' cross-sectional view illustrating one of the source/drain regions of the top-level FET(s) having been formed over one of the sacrificial contacts according to an embodiment of the present invention;

DETAILED DESCRIPTION OF PREFERRED EMBODIMENTS

As highlighted above, stacked field-effect transistor (FET) designs advantageously reduce the footprint area of the device. With these designs, at least one FET, i.e., a top-level FET(s), is/are placed vertically on top of at least one other FET, i.e., a bottom-level FET(s). However, there are some notable challenges associated with cross-level integration of the stacked devices that oftentimes involve complex, top-down interconnect schemes that lead to increased production costs, and which result in less-than-optimal contact resistance at the devices.

Advantageously, provided herein are stacked FET devices and techniques for formation thereof with local interconnect structures that enable direct contact to be made to the top-level FET(s) from the bottom, thereby eliminating the need for complex interconnects over the devices. The local interconnect structures are 'flexible' meaning that they can extend bidirectionally in either the X-direction and/or the Y-direction (see below). As such, the present local interconnect structures can be employed to link components (such as source/drain regions) of the top-level and bottom-level FETs that are not vertically aligned with one another.

Notably, the present local interconnect structures have a wrap-around design that increases the contact area and thus vastly reduces the contact resistance. As will be described in detail below, this wrap-around design leverages use of a sacrificial material during the fabrication process that can later be removed to access the bottom (along with the top and sides) of the top-level FET(s) in order to enable a wrap-around contact to be formed.

Figure 1:
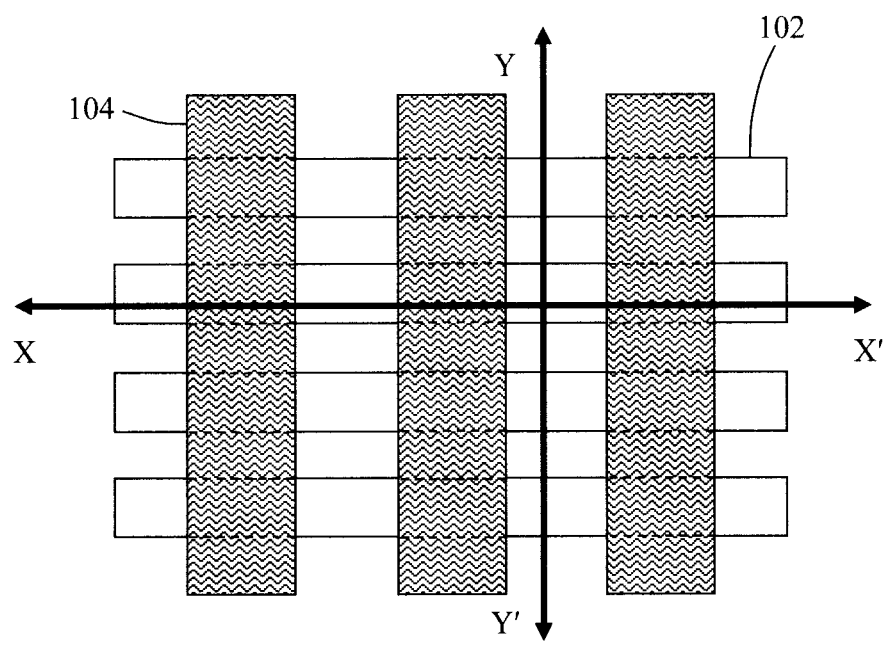
FIG. 1 is a top-down view of an exemplary bottom-level FET(s) illustrating an orientation of the X-X' and Y-Y' cross-sectional views shown in the figures according to an embodiment of the present invention.

An exemplary methodology for fabricating a stacked FET device in accordance with the present techniques is now described by way of reference to FIGS. 1-15. FIG. 1 is a top-down diagram illustrating an orientation of the cross-sectional views that will be shown in the figures that follow. Namely, as shown in FIG. 1, according to an exemplary embodiment, the bottom-level FET(s) are finFET devices that include a plurality of fins 102 extending along a first direction (in this case an X-direction). A plurality of gates 104 are present over the fins 102. As shown in FIG. 1, the gates 104 extend along a second direction (in this case a Y-direction) which is perpendicular to the first/X-direction.

The X-X' cross-sectional views that will be shown in the figures that follow will depict cuts along a given one of the fins 102, through each of the gates 104. The Y-Y' cross-sectional views that will be shown in the figures that follow will depict cuts between two of the gates 104, through each of the fins 102. It is notable however, that the present techniques are more generally applicable to any type of stacked FET device design including planar and other non-planar FETs such as nanowire/nanosheet FETs, and the implementation of a finFET design for the bottom-level FET(s) is used merely as one illustrative, non-limiting example to describe the present techniques.

Thus, according to an exemplary embodiment, the process begins with the patterning of fins 102 for at least one bottom-level FET in a substrate 202. See FIG. 2A (an X-X' cross-sectional view) and FIG. 2B (a Y-Y' cross-sectional view). According to an exemplary embodiment, substrate 202 is a bulk semiconductor wafer, such as a bulk silicon (Si), bulk germanium (Ge), bulk silicon germanium (SiGe) and/or bulk III-V semiconductor wafer. Alternatively, substrate 202 can be a semiconductor-on-insulator (SOI) wafer. A SOI wafer includes a SOI layer separated from an underlying substrate by a buried insulator. When the buried insulator is an oxide it is also referred to herein as a buried oxide or BOX. The SOI layer can include any suitable semiconductor material(s), such as Si, Ge, SiGe and/or a III-V semiconductor. Further, substrate 202 may already have pre-built structures (not shown) such as transistors, diodes, capacitors, resistors, interconnects, wiring, etc.

Standard lithography and etching techniques can be employed to pattern the fins 102 in the substrate 202. With standard lithography and etching techniques, a lithographic stack (not shown), e.g., photoresist/organic planarizing layer (OPL)/anti-reflective coating (ARC), is used to pattern a hardmask (not shown) with the footprint and location of the features to be patterned (in this case fins 102). Alternatively, the hardmask can be formed by other suitable techniques, including but not limited to, sidewall image transfer (SIT), self-aligned double patterning (SADP), self-aligned quadruple patterning (SAQP), and other self-aligned multiple patterning (SAMP). An etch is then used to transfer the pattern of the fins 102 from the hardmask to the underlying substrate 202. A directional (anisotropic) etching process such as reactive ion etching (RIE) can be employed for the fin etch. As shown for example in FIG. 2A, as-patterned, the fins 102 extend partway through the substrate 202. After that, shallow trench isolation (STI) regions 214 (see FIG. 2B) are formed at the base of the fins 102 by dielectric deposition, chemical-mechanical polishing (CMP), and dielectric recess. The hardmask is then removed.

Figure 2A:
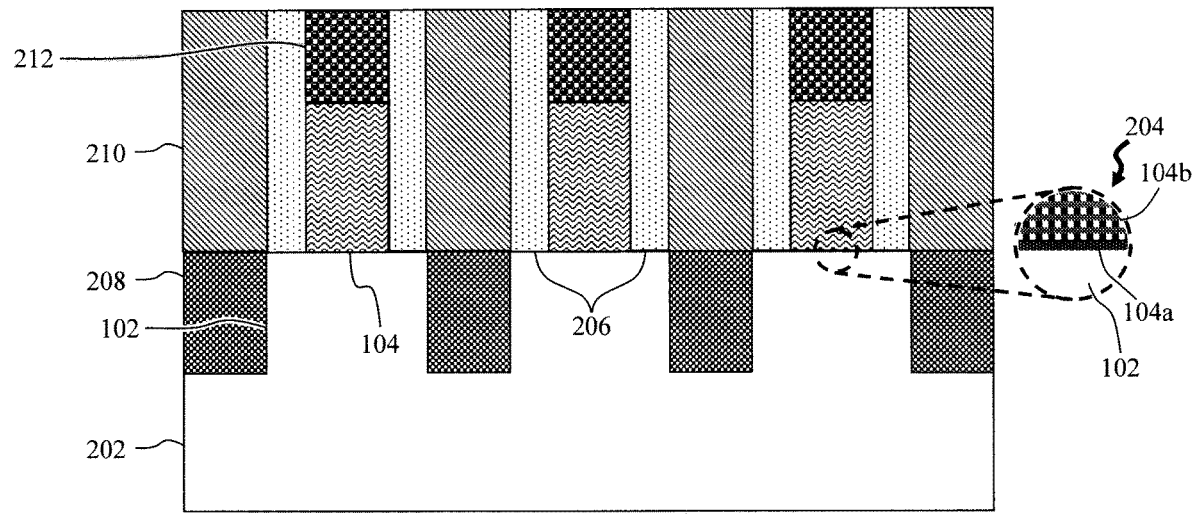
FIG. 2A is an X-X' cross-sectional view illustrating fins for a bottom-level FET(s) having been patterned in a substrate, gates having been formed over the fins, gate spacers having been formed on opposite sides of the gates, source/drain regions of the bottom-level FET(s) having been formed in the fins on opposite sides of the gates/gate spacers, a (first) interlayer dielectric (ILD) having been deposited over the source/drain regions and surrounding the gates/gate spacers, and dielectric caps having been formed over the gates.

Gates 104 are then formed over portions of the fins 102 that will serve as channel regions of the bottom-level FET(s), gate spacers 206 are formed on opposite sides of the gates 104, and source/drain regions 208 of the bottom-level FET(s) are formed in the fins 102 on opposite sides of the gates 104/gate spacers 206. As shown in FIG. 2A, gate spacers 206 offset the source/drain regions 208 from the gates 104.

As shown in magnified view 204 (see FIG. 2A), according to an exemplary embodiment, each of the gates 104 includes a gate dielectric 104a and a gate conductor 104b disposed on the gate dielectric 104a. Although not explicitly shown in magnified view 204, a thin (e.g., from about 0.3 nm to about 5 nm) interfacial oxide (e.g., silicon oxide (SiOx) which may include other chemical elements in it such as nitrogen (N), germanium (Ge), etc.) can first be formed on exposed surfaces of the fins 102, and the gate dielectric 104a can then be deposited over the interfacial oxide using a process such as chemical vapor deposition (CVD), atomic layer deposition (ALD), or physical vapor deposition (PVD). Generally, the present techniques can be implemented in conjunction with either a gate-first or a gate-last process. A gate-first process involves forming the gates 104 over the channel region prior to placement of the source/drain regions 208. By contrast, with a gate-last approach, sacrificial gates (not shown) are formed over the channel region early on in the fabrication process. The term 'sacrificial,' as used herein, generally refers to a structure that is removed, in whole or in part, during fabrication. The sacrificial gates are then used to place the source/drain regions 208 on opposite ends of the channel region. The sacrificial gates are then removed and replaced with the final (replacement) gates of the device which are illustrated in this example by gates 104. When the replacement gates are metal gates, they are also referred to herein as replacement metal gates or RMGs. A notable advantage of the gate-last approach is that it prevents the final gate components from being exposed to potentially damaging conditions, such as elevated temperatures, experienced during fabrication. Of particular concern are high-κ gate dielectrics which can be damaged by exposure to elevated temperatures such as those experienced during formation of the source/drain regions 208.

Suitable materials for the gate dielectric 104a include, but are not limited to, silicon dioxide ($SiO_2$) and/or a high-K material. The term "high-K," as used herein, refers to a material having a relative dielectric constant κ which is much higher than that of $SiO_2$ (e.g., a dielectric constant κ=25 for hafnium oxide ($HfO_2$) rather than 4 for $SiO_2$). Suitable high-K gate dielectrics include, but are not limited to, $HfO_2$ and/or lanthanum oxide ($La_2O_3$).

Suitable materials for the gate conductor 104b include, but are not limited to, doped polysilicon and/or at least one workfunction-setting metal. Suitable n-type workfunction-setting metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nanometers (nm)) may also be used beneath Al-containing alloys in n-type workfunction-setting stacks to improve electrical properties such as gate leakage currents. Thus, there is some overlap in the exemplary n- and p-type workfunction-setting metals given above. A process such as CVD, ALD, evaporation, sputtering or electrochemical plating can be employed to deposit the gate conductor 104b over the gate dielectric 104a. Suitable materials for gate spacers 206 include, but are not limited to, oxide spacer materials such as SiOx and/or silicon oxycarbide (SiOC) and/or nitride spacer materials such as silicon nitride (SiN), silicon borocarbonitride (SiBCN) and/or silicon oxycarbonitride (SiOCN).

According to an exemplary embodiment, source/drain regions 208 are formed from an in-situ doped (i.e., where a dopant(s) is introduced during growth) or ex-situ doped (e.g., where a dopant(s) is introduced by ion implantation) epitaxial material such as epitaxial Si, epitaxial SiGe, etc. Suitable n-type dopants include, but are not limited to, phosphorous (P) and/or arsenic (As). Suitable p-type dopants include, but are not limited to, boron (B).

An interlayer dielectric (ILD) 210 is then deposited over the source/drain regions 208 and surrounding the gates 104/gate spacers 206. Suitable ILD 210 materials include, but are not limited to, oxide materials such as SiOx and/or organosilicate glass (SiCOH) and/or ultralow-κ interlayer dielectric (ULK-ILD) materials, e.g., having a dielectric constant κ of less than 2.7. Suitable ultralow-κ dielectric materials include, but are not limited to, porous organosilicate glass (pSiCOH). A process such as CVD, ALD, or PVD can be used to deposit the ILD 210.

As shown in FIG. 2A, the tops of the gates 104 are recessed below the tops of the gate spacers 206, and dielectric caps 212 are formed over the (recessed) gates 104. Suitable materials for the dielectric caps 212 include, but are not limited to, SiOx and/or SiN. The dielectric caps 212 will serve to protect the underlying gates 104 during formation of source/drain contacts over the source/drain regions 208 (see below).

Figure 2B:
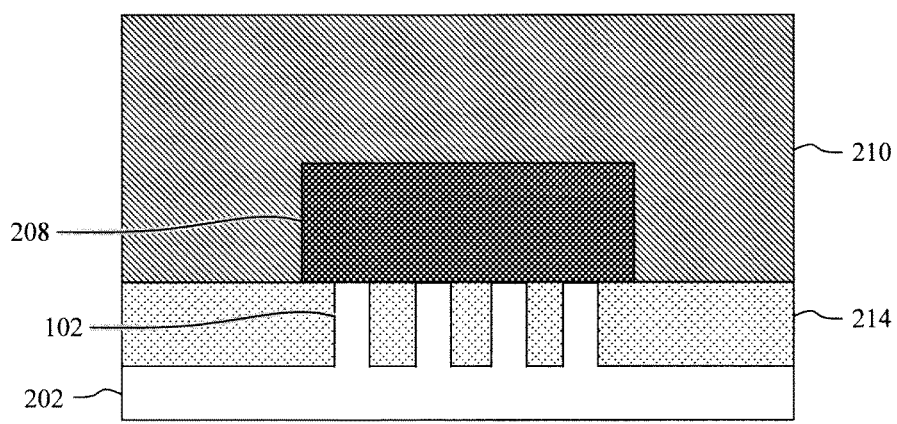
FIG. 2B is a Y-Y' cross-sectional view illustrating the fins for the bottom-level FET(s) having been patterned in the substrate, shallow trench isolation (STI) regions having been formed at the base of the fins, the source/drain regions having been formed in the fins (over the STI regions), and the first ILD having been deposited over the source/drain regions according to an embodiment of the present invention.

Referring to FIG. 2B it can be seen that shallow trench isolation (STI) regions 214 are formed at the base of the fins 102. Namely, following patterning of the fins 102 (see above), a dielectric material such as an oxide material (also referred to herein generally as an 'STI oxide') is deposited into and filling the gaps between the fins 102, which is then recessed to form STI regions 214 that isolate the fins 102. Although not explicitly shown in the figures, a liner (e.g., a thermal oxide or silicon nitride (SiN)) may be deposited prior to the STI oxide. Suitable STI oxides include, but are not limited to, oxide low-κ materials such as SiOx and/or oxide ULK-ILD materials such as pSiCOH. A process such as CVD, ALD, or PVD can be used to deposit the STI oxide. An oxide-selective etch can then be employed to recess the STI oxide. As described above, the source/drain regions 208 are then formed in the fins 102 (over the STI regions 214), and the ILD 210 is deposited over the source/drain regions 208.

Source/drain contacts 302 of the bottom-level FET(s) (also referred to herein as "bottom-level FET source/drain contacts") are then formed over, and in direct contact with, the source/drain regions 208. See FIG. 3A (an X-X' cross-sectional view) and FIG. 3B (a Y-Y' cross-sectional view). To form the source/drain contacts 302 of the bottom-level FET(s), standard lithography and etching techniques (see above) are first employed to pattern contact trenches in the ILD 210 over the source/drain regions 208. Dotted lines 300 are used to illustrate the outlines of the contact trenches. A contact metal or a combination of contact metals is/are then deposited into the contact trenches to form the source/drain contacts 302 of the bottom-level FET(s) in the contact trenches. Suitable contact metals include, but are not limited to, titanium (Ti), titanium nitride (TiN), nickel (Ni), nickel platinum (NiPt), copper (Cu), cobalt (Co), ruthenium (Ru) and/or tungsten (W). A process such as CVD, ALD, evaporation, sputtering or electrochemical plating can be employed to deposit the contact metal(s) into the contact trenches.

Figure 3A:
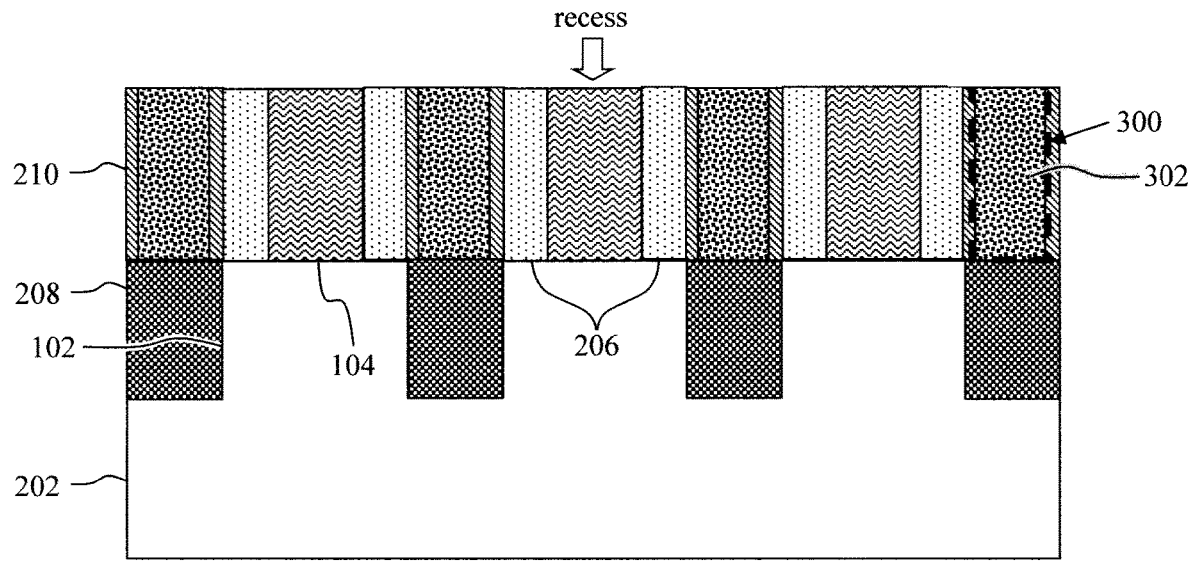
FIG. 3A is an X-X' cross-sectional view illustrating bottom-level FET source/drain contacts of the bottom-level FET(s) having been formed over, and in direct contact with, the source/drain regions of the bottom-level FET(s)
Figure 3B:
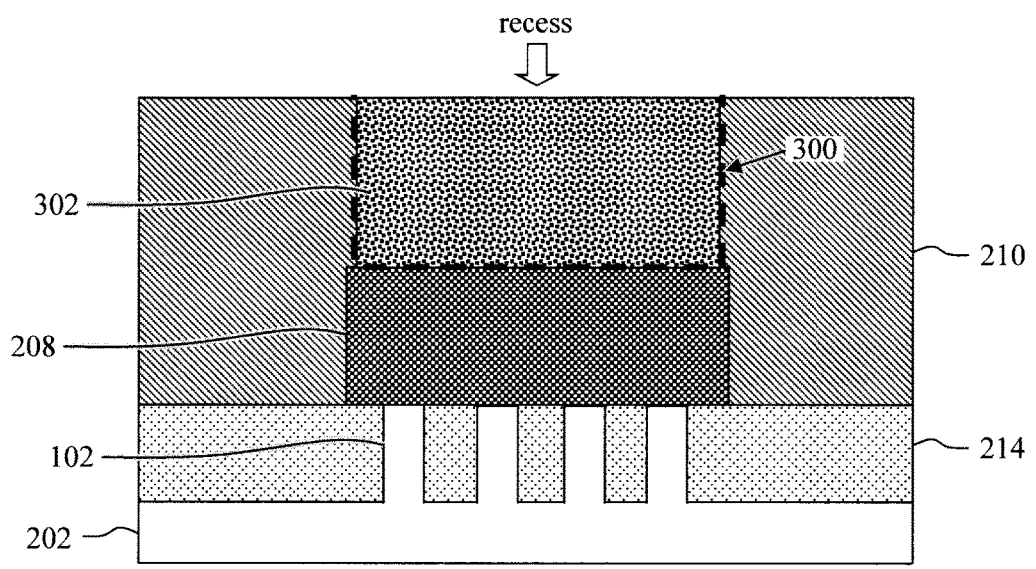
FIG. 3B is a Y-Y' cross-sectional view illustrating the bottom-level FET source/drain contacts of the bottom-level FET(s) having been formed over, and in direct contact with, the source/drain regions of the bottom-level FET(s) according to an embodiment of the present invention.

Following formation of the source/drain contacts 302 of the bottom-level FET(s), a recess etch of the gate spacers 206/ILD 210 and excess contact metal(s) is performed to expose the tops of the gates 104. A process such as CMP can be employed for the recess etch. As shown in FIG. 3A, this process removes the dielectric caps 212 from over the gates 104. FIG. 3B further illustrates the above-described process of patterning contact trenches in the ILD 210 over the source/drain regions 208 (see dotted lines 300), forming the source/drain contacts 302 of the bottom-level FET(s) in the contact trenches, and recessing of the ILD 210 and excess contact metal(s).

An ILD 402 is then deposited onto the ILD 210 over the gates 104/gate spacers 206, the source/drain regions 208, and the source/drain contacts 302 of the bottom-level FET(s). See FIG. 4A (an X-X' cross-sectional view) and FIG. 4B (a Y-Y' cross-sectional view). The terms 'first' and 'second' may also be used herein when referring to ILD 210 and ILD 402, respectively. Suitable ILD 402 materials include, but are not limited to, oxide materials such as SiOx and/or SiCOH, and/or ULK-ILD materials such as pSiCOH. A process such as CVD, ALD, or PVD can be used to deposit the ILD 402. Following deposition, the ILD 402 can be planarized using a process such as CMP.

Figure 4A:
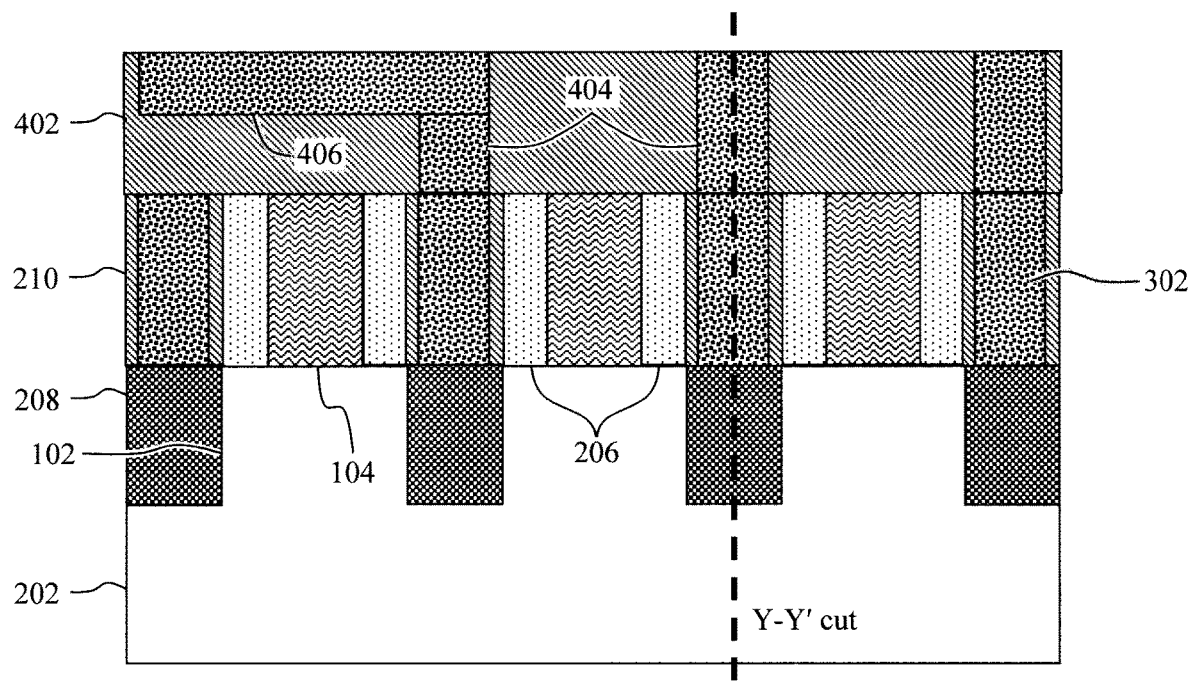
FIG. 4A is an X-X' cross-sectional view illustrating a (second) ILD having been deposited onto the first ILD over the bottom-level FET(s), and lower contact vias and (bidirectional) local interconnects having been formed in the second ILD.

Standard metallization processes are then employed to form lower contact vias 404 and local interconnects 406 in the ILD 402. As shown in FIG. 4A, the lower contact vias 404 are present over, and in direct contact with, the underlying source/drain contacts 302 of the bottom-level FET(s) over the source/drain regions 208. Each local interconnect 406 directly contacts a given one of the lower contact vias 404. As will become apparent from the description that follows, the local interconnects 406 serve to extend the lower contact vias 404 in order to enable direct access to the bottom of the top-level FET(s). Advantageously, the placement of the local interconnects 406 is 'flexible' in the sense that the dimensions of local interconnects 406 in both the X-direction and the Y-direction (bidirectionality) can be configured as needed to enable interconnection between the source/drain contacts 302 of the bottom-level FET(s) with the corresponding source/drain contacts of the top-level FET(s) even if the bottom- and top-level source/drain contacts are not vertically aligned with one another.

Figure 4B:
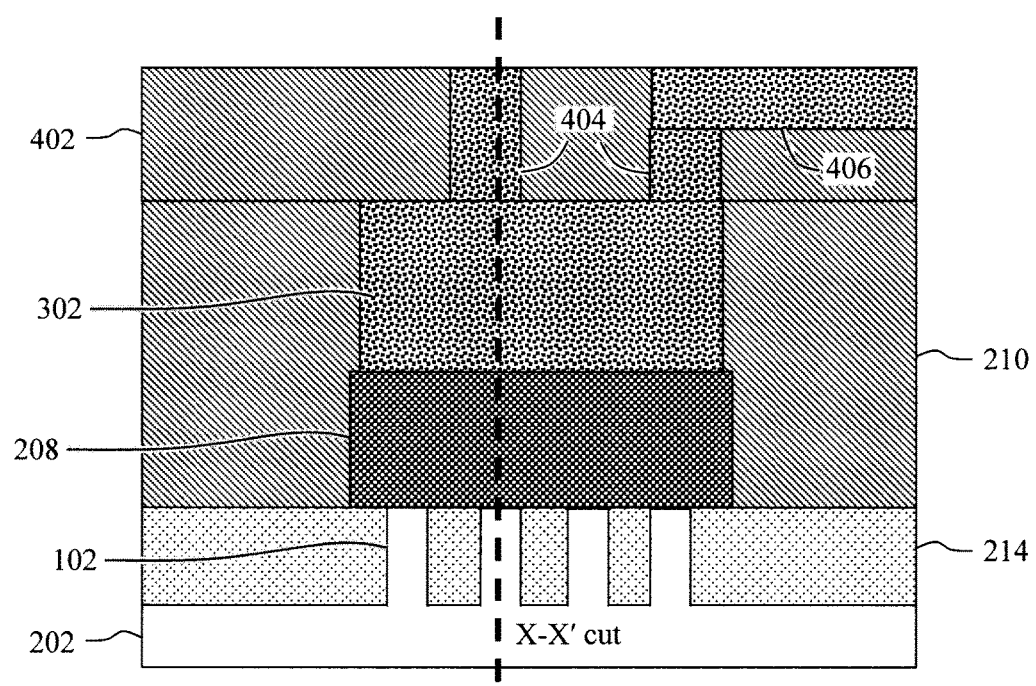
FIG. 4B is a Y-Y' cross-sectional view illustrating the second ILD having been deposited onto the first ILD over the bottom-level FET(s), and the lower contact vias and the (bidirectional) local interconnects having been formed in the second ILD according to an embodiment of the present invention.

In order to help illustrate the arrangement of the various structures including the lower contact vias 404 and the local interconnects 406 amongst the views shown, the orientation of the Y-Y' cut (shown in FIG. 4B) and the orientation of the X-X' cut (shown in FIG. 4A) are marked in FIG. 4A and FIG. 4B, respectively. For ease and clarity of depiction, these designations are not marked in the remaining figures. However, it is to be understood that the orientation of the Y-Y' cuts and the orientation of the X-X' cuts are the same as that shown in FIG. 4A and FIG. 4B. Further, based on these designations, it should be recognized that FIG. 4A (and the X-X' cross-sectional views that follow) depicts a different local interconnect 406 than FIG. 4B (and the Y-Y' cross-sectional views that follow). Namely, the local interconnect 406 depicted in the X-X' cross-sectional views extends in the gate direction (across the gates 104), whereas the local interconnect 406 depicted in the Y-Y' cross-sectional views extends in a gate width direction (across the fins 102).

By way of example only, a dual damascene process can be employed to form the lower contact vias 404 and local interconnects 406 in the ILD 402. With a dual damascene process, standard lithography and etching techniques (see above) are first used to pattern features in the ILD 402 such as trenches and vias, with the trench positioned over the via. When a trench is patterned before the via, it is referred to as a trench-first process. Conversely, when a via is patterned before the trench, it is referred to as a via-first process. The features (i.e., trenches and/or vias) are then filled with a metal or a combination of metals to form the lower contact vias 404 and local interconnects 406. Suitable metals include, but are not limited to, Cu, tungsten (W), ruthenium (Ru), cobalt (Co), nickel (Ni) and/or platinum (Pt). The contact metal(s) can be deposited into the trenches and/or vias using a process such as evaporation, sputtering, or electrochemical plating. Following deposition, the metal overburden can be removed using a process such as CMP. Prior to depositing the metal(s), a barrier layer (not shown) can be deposited into and lining the trenches and/or vias. Use of such a barrier layer helps to prevent diffusion of the metal(s) into the surrounding ILD 402. Suitable barrier layer materials include, but are not limited to, tantalum (Ta), TaN, titanium (Ti) and/or TiN. Additionally, a seed layer (not shown) can be deposited into and lining the trenches and/or vias prior to metal deposition, i.e., to facilitate plating of the metal into the trenches and/or vias.

FIG. 4B further illustrates the above-described process of forming lower contact vias 404 in the ILD 402 that directly contact the underlying source/drain contacts 302 of the bottom-level FET(s) over the source/drain regions 208, and forming local interconnects 406 in the ILD 402, whereby each local interconnect 406 directly contacts a given one of the lower contact vias 404. As highlighted above, FIG. 4A and FIG. 4B demonstrate how the dimensions of the various local interconnects 406 in both the X-direction and the Y-direction, respectively, can be configured as needed to enable interconnection between the source/drain contacts 302 of the bottom-level FET(s) with the corresponding source/drain contacts of the top-level FET(s).

As highlighted above, a unique contact design is employed herein where the contacts wrap-around the source/drain regions of the top-level FET(s). As will be described in detail below, these wrap-around contacts directly contact either one of the lower contact vias 404 or one of the local interconnects 406 thereby permitting access to the top-level FET(s) directly from the bottom. To form the wrap-around contacts, a sacrificial layer 502 is first deposited onto the ILD 402 over the lower contact vias 404 and the local interconnects 406. See FIG. 5A (an X-X' cross-sectional view) and FIG. 5B (a Y-Y' cross-sectional view).

Figure 5A:
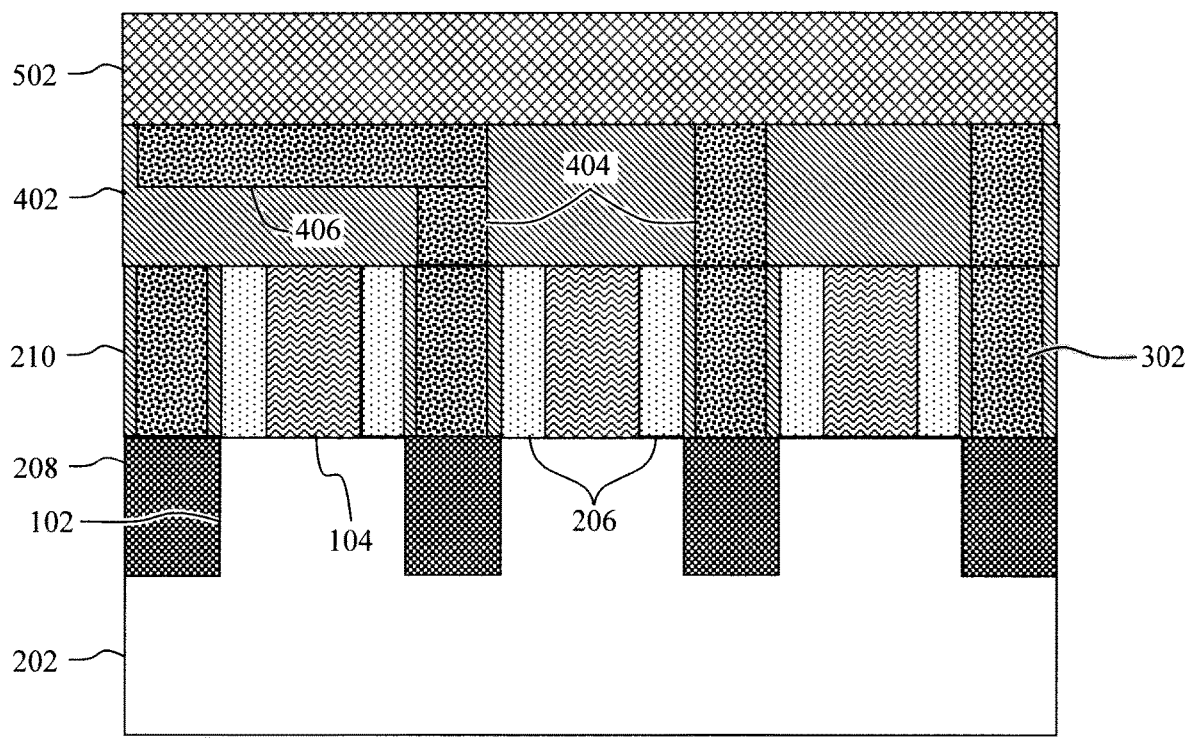
FIG. 5A is an X-X' cross-sectional view illustrating a sacrificial layer having been deposited onto the second ILD over the lower contact vias and the local interconnects.
Figure 5B:
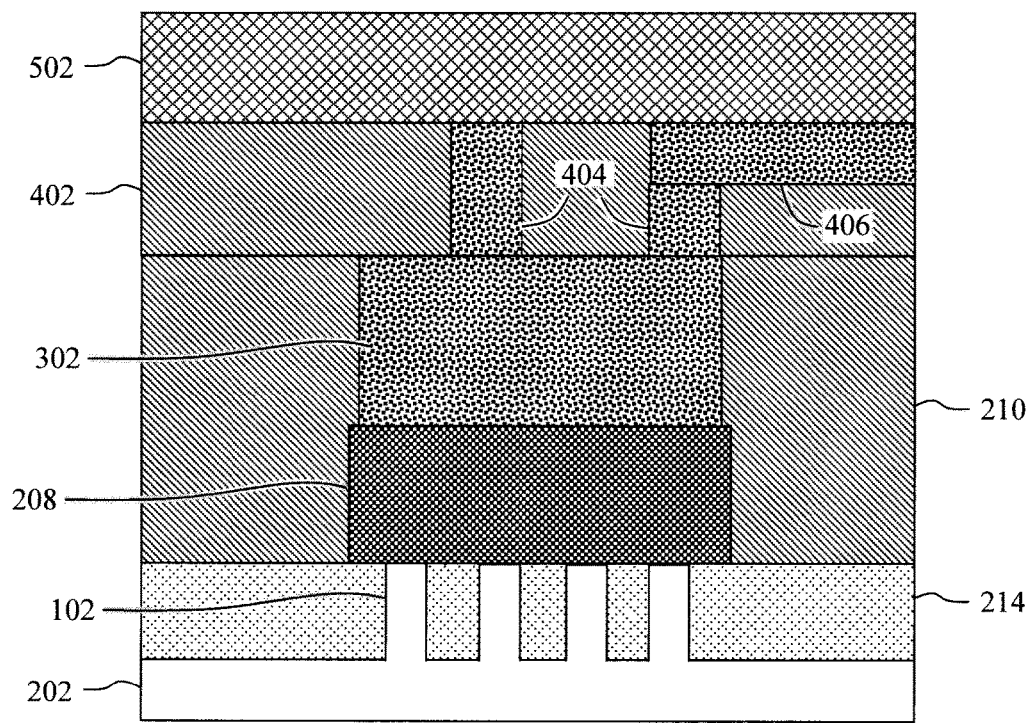
FIG. 5B is a Y-Y' cross-sectional view illustrating the sacrificial layer having been deposited onto the second ILD over the lower contact vias and the local interconnects according to an embodiment of the present invention.

A requirement of the sacrificial layer 502 is that it is formed from a material that can be removed via an etch selective to ILD 210, ILD 402, and the other ILD layers (i.e., ILD 702, ILD 902, etc.) to be formed below. By way of example only, suitable materials for the sacrificial layer 502 include, but are not limited to, amorphous silicon (a-Si) and/or titanium oxide (TiOx). For instance, an etch using a fluorine-containing and/or chlorine-containing plasma can be employed to selectively etch TiOx relative to SiOx, SiN and/or other dielectrics. See, for example, U.S. Pat. No. 9,287,134 issued to Wang et al., entitled "Titanium Oxide Etch." A process such as CVD, ALD, or PVD can be used to deposit the sacrificial layer 502. According to an exemplary embodiment, the sacrificial layer 502 is deposited to a thickness of from about 2 nanometers (nm) to about 10 nm and ranges therebetween. Notably, as shown in FIG. 5A and FIG. 5B, the sacrificial layer 502 is disposed in direct contact with the local interconnects 406 and one or more of the lower contact vias 404.

Figure 6A:
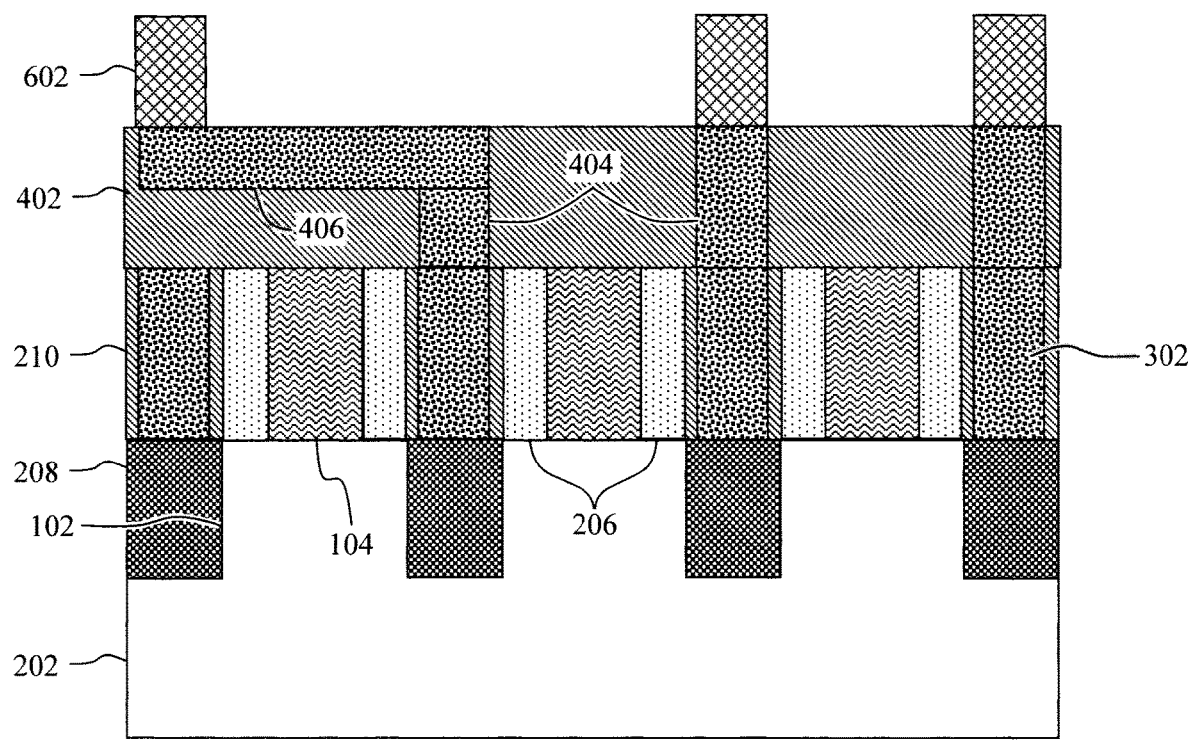
FIG. 6A is an X-X' cross-sectional view illustrating the sacrificial layer having been patterned into a plurality of individual sacrificial contacts over the lower contact vias and the local interconnects.
Figure 6B:
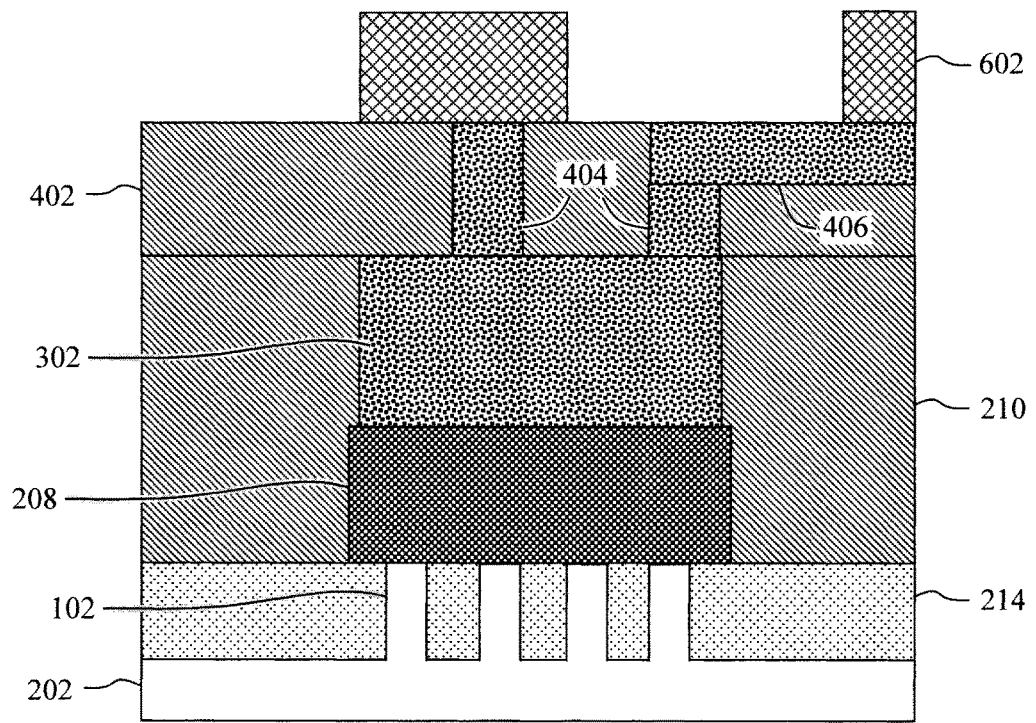
FIG. 6B is a Y-Y' cross-sectional view illustrating the sacrificial layer having been patterned into the plurality of individual sacrificial contacts over the lower contact vias and the local interconnects according to an embodiment of the present invention.

Standard lithography and etching techniques (see above) are then employed to pattern the sacrificial layer 502 into a plurality of individual sacrificial contacts 602 over the lower contact vias 404 and the local interconnects 406. See FIG. 6A (an X-X' cross-sectional view) and FIG. 6B (a Y-Y' cross-sectional view). As will be described in detail below, the sacrificial contacts 602 will be removed later on in the process and replaced with i) wrap-around source/drain contacts of the top-level FET(s) (that are connected below to the source/drain contacts 302 of the bottom-level FET(s) by way of the local interconnects 406 and/or one or more of the lower contact vias 404) and ii) upper contact vias (that are connected to the source/drain contacts 302 of the bottom-level FET(s) by way of one or more of the lower contact vias 404). For instance, as shown in FIG. 6A, in one exemplary embodiment, a sacrificial contact 602 is formed over the local interconnects 406 and over each of the lower contact vias 404. FIG. 6B further illustrates the above-described process of patterning sacrificial layer 502 into a plurality of the individual sacrificial contacts 602 over the lower contact vias 404 and the local interconnects 406.

At least one top-level FET is then fabricated on the ILD 402 over the lower contact vias 404/local interconnects 406 and sacrificial contacts 602. To do so, an ILD 702 is first deposited onto the ILD 402 covering the lower contact vias 404/local interconnects 406 and sacrificial contacts 602. See FIG. 7A (an X-X' cross-sectional view) and FIG. 7B (a Y-Y' cross-sectional view). The term 'third' may also be used herein when referring to ILD 702 so as to distinguish it from the 'first' ILD 210 and the 'second' ILD 402. Suitable ILD 702 materials include, but are not limited to, oxide materials such as SiOx and/or SiCOH, and/or ULK-ILD materials such as pSiCOH. A process such as CVD, ALD, or PVD can be used to deposit the ILD 702. Following deposition, the ILD 702 can be planarized using a process such as CMP.

Figure 7A:
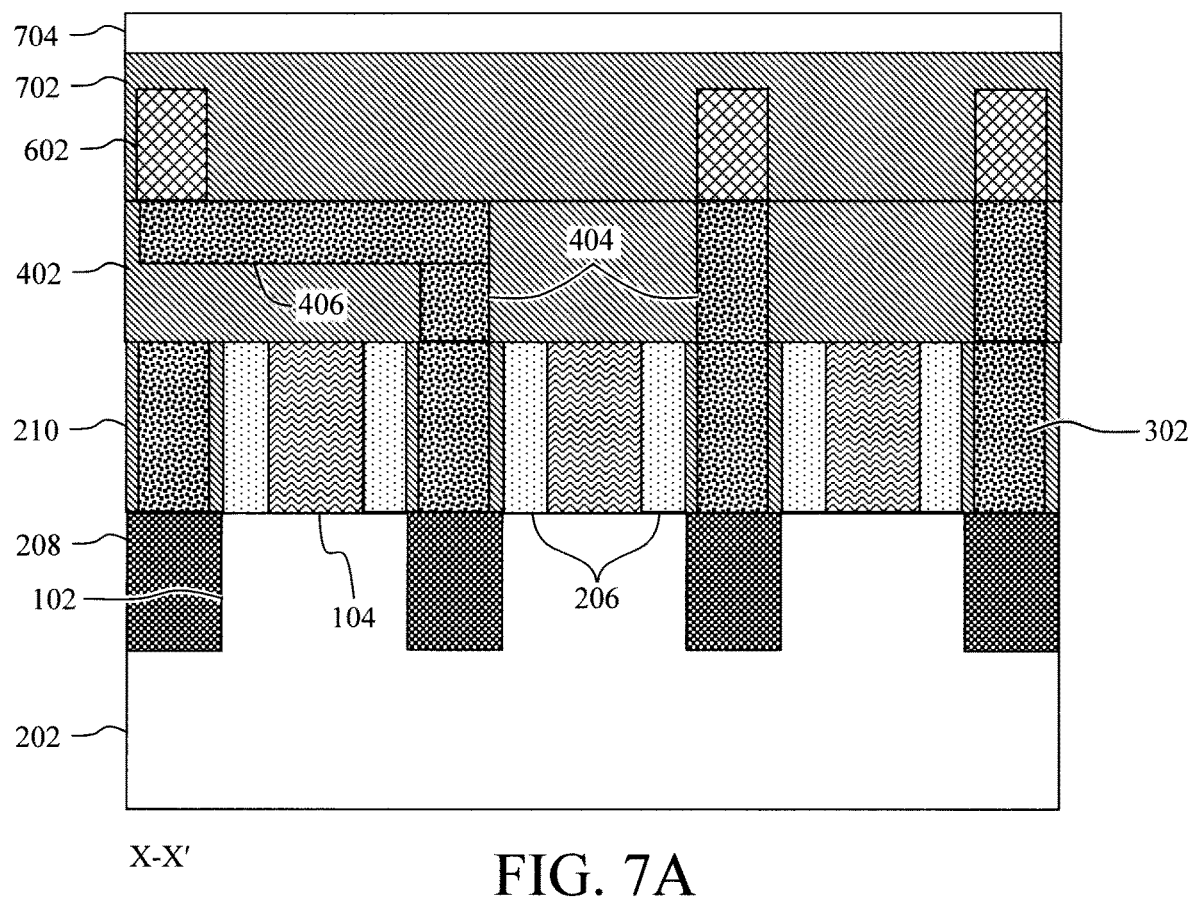
FIG. 7A is an X-X' cross-sectional view illustrating a (third) ILD having been deposited onto the second ILD covering the lower contact vias/the local interconnects and the sacrificial contacts, and a channel layer of a top-level FET(s) having been formed on the third ILD over the lower contact vias/the local interconnects and the sacrificial contacts.
Figure 7B:
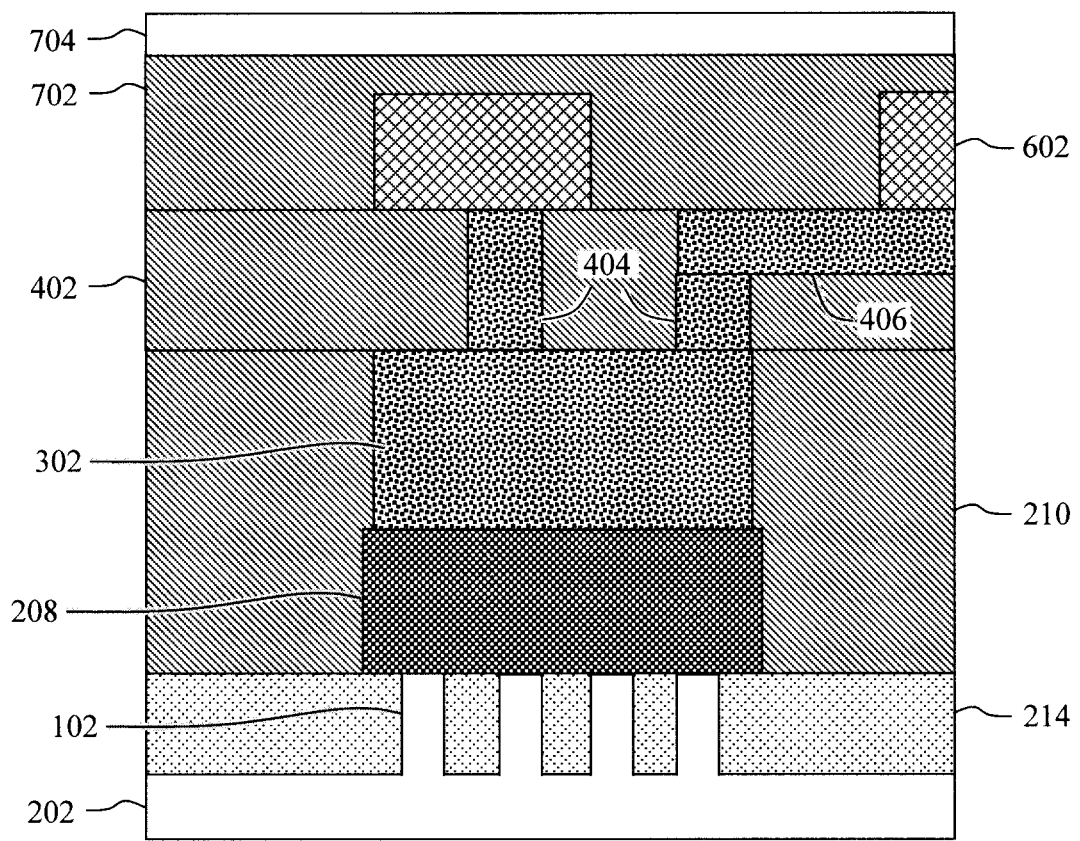
FIG. 7B is a Y-Y' cross-sectional view illustrating the third ILD having been deposited onto the second ILD covering the lower contact vias/the local interconnects and the sacrificial contacts, and the channel layer of the top-level FET(s) having been formed on the third ILD over the lower contact vias/the local interconnects and the sacrificial contacts according to an embodiment of the present invention.

A channel layer 704 of the top-level FET(s) is then formed on the ILD 702 over the lower contact vias 404/local interconnects 406 and sacrificial contacts 602. Channel layer 704 is formed from a semiconductor material. Suitable semiconductor materials for the channel layer 704 include, but are not limited to, Si, Ge, SiGe and/or a III-V semiconductor. The channel layer 704 can be formed on the ILD 702 in a number of ways. For instance, the channel layer 704 can be formed on the ILD 702 using a thin-film transistor (TFT) process whereby a layer of the semiconductor material is coated on the top surface of the ILD 702. Alternatively, the channel layer 704 can be formed on the ILD 702 using a wafer bonding technique. For instance, by way of example only, an Si substrate can be bonded to the current wafer using dielectric-to-dielectric bonding, followed by Si thinning, leaving the remaining Si substrate for top device fabrication. Both TFT and wafer-bonding processes are well-known in the art, and thus are not described in further detail herein. FIG. 7B further illustrates the above-described process of depositing the ILD 702 onto the ILD 402 covering the lower contact vias 404/local interconnects 406 and sacrificial contacts 602, and forming the channel layer 704 of the top-level FET(s) on the ILD 702.

According to an exemplary embodiment, the channel layer 704 has a thickness of from about 10 angstroms (Å) to about 500 Å and ranges therebetween, and the top-level FET(s) are planar, ultrathin silicon-on-insulator (UTSOI) body devices. However, as with the bottom-level FET(s), it is noted that the present techniques are more generally applicable to any type of top-level FET design including other planar and non-planar FETs such as finFETs, nanowire/nanosheet FETs, etc., and the implementation of a UTSOI FET for the top-level FET(s) is used merely as one illustrative, non-limiting example to describe the present techniques.

Figure 8A:
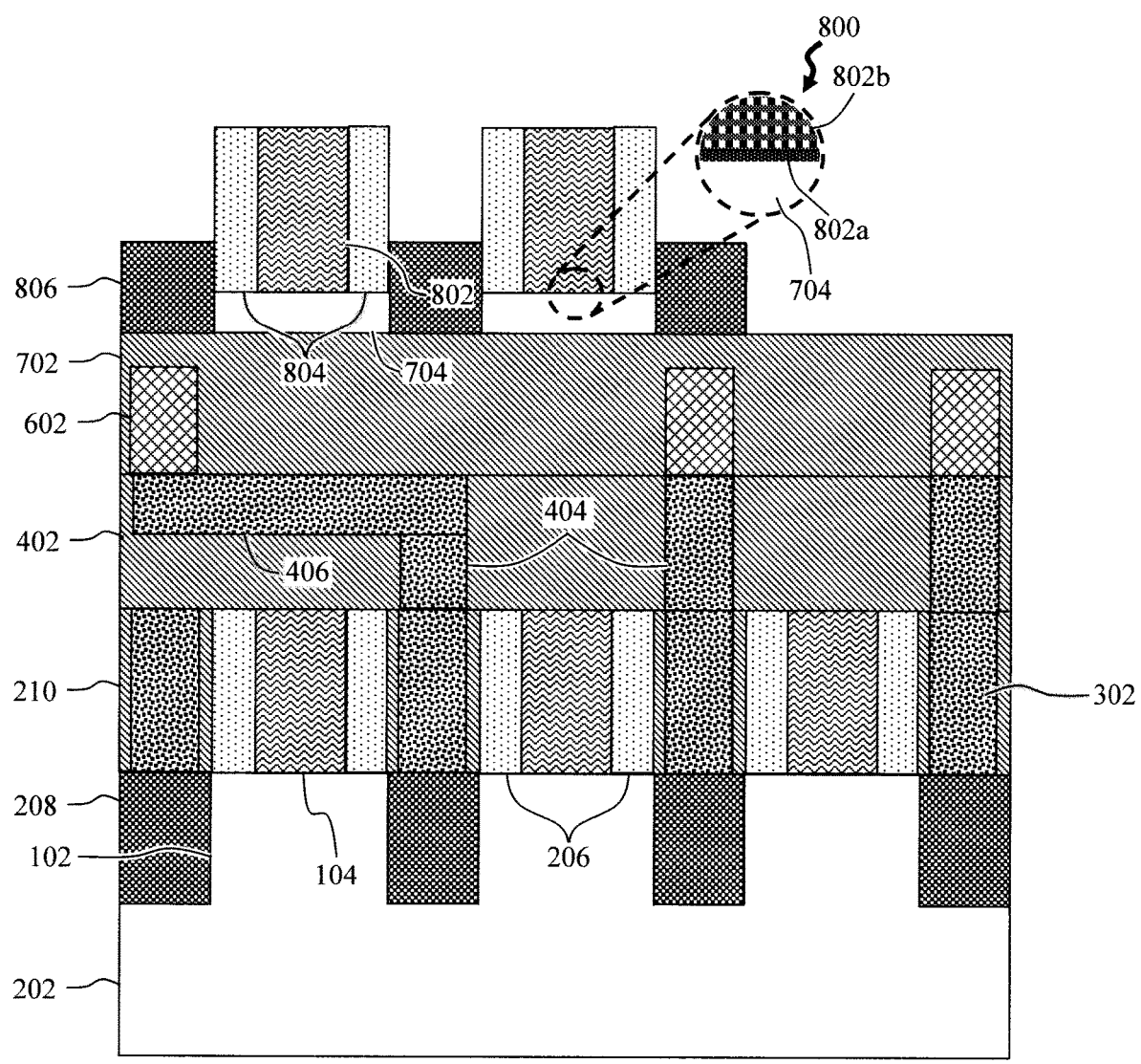
FIG. 8A is an X-X' cross-sectional view illustrating gates of the top-level FET(s) having been formed over the channel layer, gate spacers having been formed on opposite sides of the gates, and source/drain regions of the top-level FET(s) having been formed in the channel layer on opposite sides of the gates/gate spacers of the top-level FET(s)
Figure 9A:
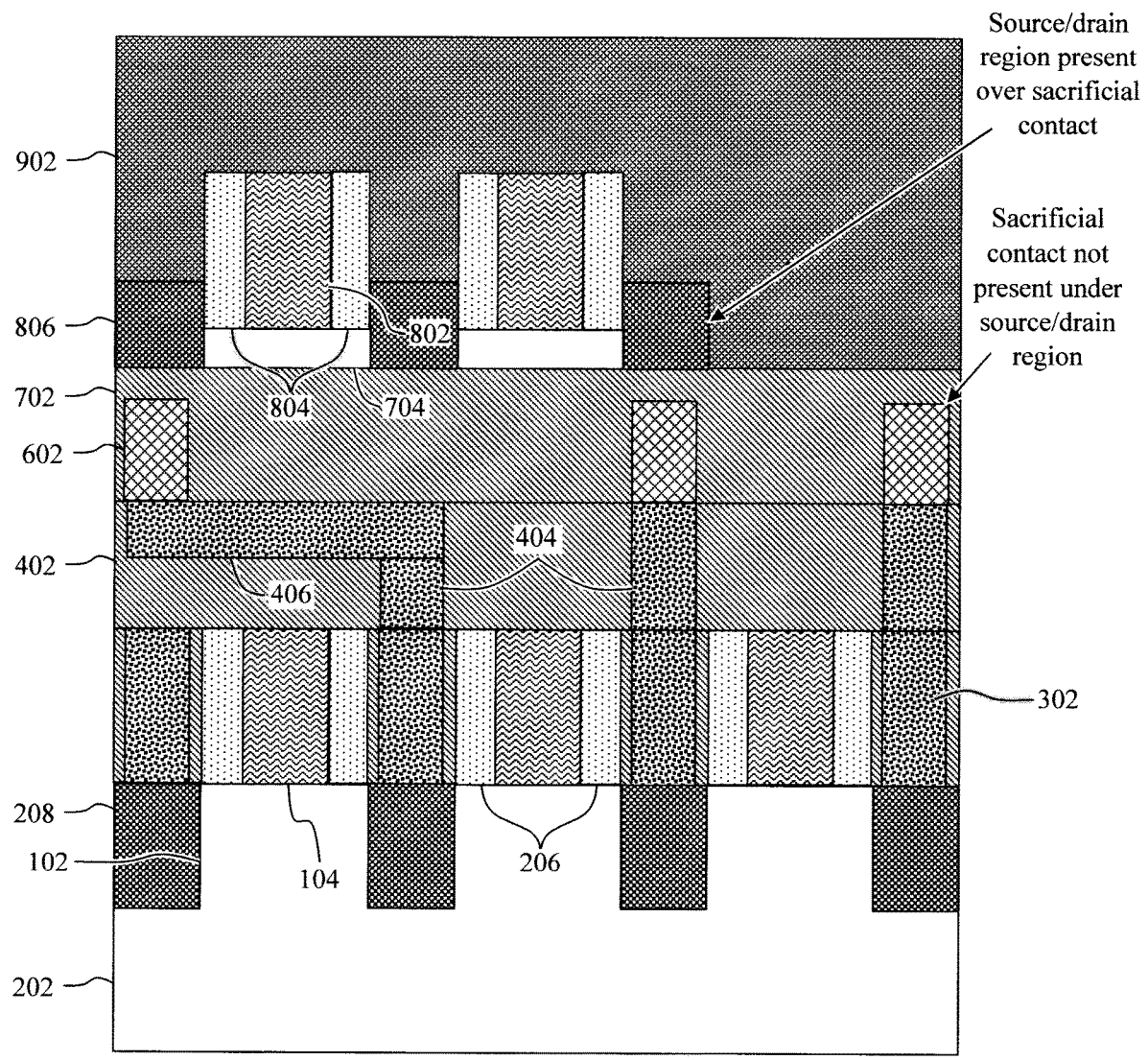
FIG. 9A is an X-X' cross-sectional view illustrating a (fourth) ILD having been deposited onto the third ILD covering the top-level FET(s)
Figure 9B:
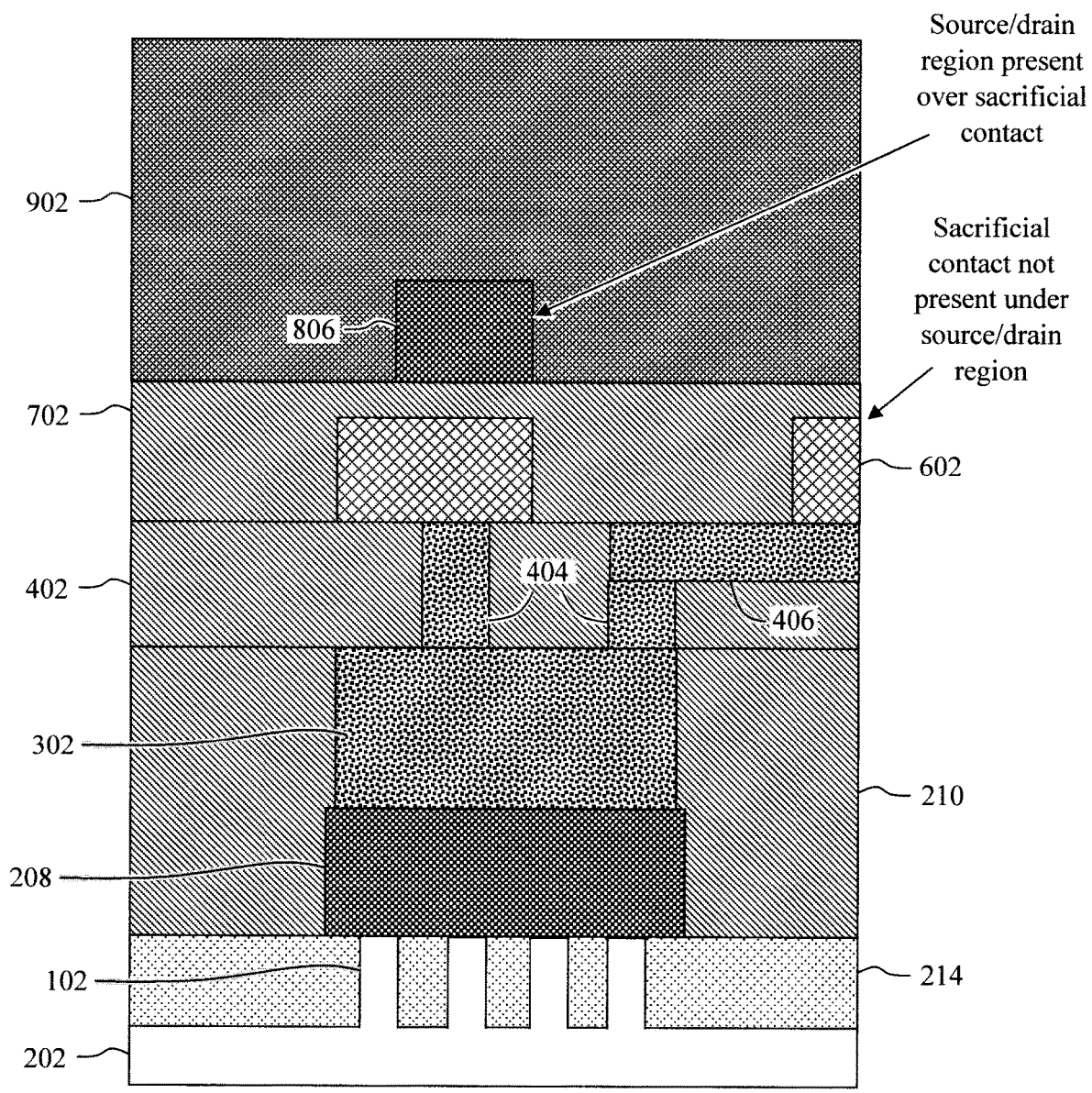
FIG. 9B is a Y-Y' cross-sectional view illustrating the fourth ILD having been deposited onto the third ILD covering the top-level FET(s) according to an embodiment of the present invention.

Gates 802 are then formed over portions of the channel layer 704 that will serve as channel regions of the top-level FET(s), gate spacers 804 are formed on opposite sides of the gates 802, and source/drain regions 806 of the top-level FET(s) are formed in the channel layer 704 on opposite sides of the gates 802/gate spacers 804. See FIG. 8A (an X-X' cross-sectional view) and FIG. 8B (a Y-Y' cross-sectional view). As shown in FIG. 8A, the gate spacers 804 offset the source/drain regions 806 from the gates 802.

As shown in magnified view 800 (see FIG. 8A), according to an exemplary embodiment, each of the gates 802 includes a gate dielectric 802a and a gate conductor 802b disposed on the gate dielectric 802a. Although not explicitly shown in magnified view 800, a thin (e.g., from about 0.3 nm to about 5 nm) interfacial oxide (e.g., SiOx which may include other chemical elements in it such as N, Ge, etc.) can first be formed on the channel layer 704, and the gate dielectric 802a can then be deposited over the interfacial oxide using a process such as CVD, ALD or PVD.

Suitable materials for the gate dielectric 802a include, but are not limited to, $SiO_2$ and/or a high-κ material such as $HfO_2$ and/or $La_2O_3$. Suitable materials for the gate conductor 802b include, but are not limited to, doped polysilicon and/or at least one workfunction-setting metal. As provided above, suitable n-type workfunction-setting metals include, but are not limited to, TiN, TaN and/or Al-containing alloys such as TiAl, TiAlN, TiAlC, TaAl, TaAlN, and/or TaAlC. Suitable p-type workfunction-setting metals include, but are not limited to, TiN, TaN, and/or W. As described above, TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Thus, there is some overlap in the exemplary n- and p-type workfunction-setting metals given above. A process such as CVD, ALD, evaporation, sputtering or electrochemical plating can be employed to deposit the gate conductor 802b over the gate dielectric 802a. Suitable materials for gate spacers 804 include, but are not limited to, oxide spacer materials such as SiOx and/or SiOC and/or nitride spacer materials such as SiN, SiBCN and/or SiOCN.

According to an exemplary embodiment, source/drain regions 806 are formed from an in-situ or ex-situ doped epitaxial material such as epitaxial Si, epitaxial SiGe, etc. As provided above, suitable n-type dopants include, but are not limited to, P and/or As. Suitable p-type dopants include, but are not limited to, B.

As shown in FIG. 8A, at least one of the source/drain regions 806 is present over a sacrificial contact 602. In that regard, FIG. 8B depicts one of the source/drain regions 806 that is present over a sacrificial contact 602. In the figures that follow, this (Y-Y') perspective will further illustrate the wrap-around nature of the source/drain contacts of the top-level FET(s). As highlighted above, the present wrap-around source/drain contacts of the top-level FET(s) advantageously increase the contact area vastly reducing the contact resistance. As further illustrated in FIG. 8A and FIG. 8B, according to an exemplary embodiment, at least another one of the sacrificial contacts 602 is not present under one of the source/drain regions 806. As will be described in detail below, these other sacrificial contacts 602 will be used to form upper contact vias that are connected directly to the lower contact vias 404.

With fabrication of the top-level FET(s) completed, an ILD 902 is next deposited onto the ILD 702 covering the top-level FET(s). See FIG. 9A (an X-X' cross-sectional view) and FIG. 9B (a Y-Y' cross-sectional view). The term 'fourth' may also be used herein when referring to ILD 902 so as to distinguish it from the 'first' ILD 210, the 'second' ILD 402, and the 'third' ILD 702. Suitable ILD 902 materials include, but are not limited to, oxide materials such as SiOx and/or SiCOH, and/or ULK-ILD materials such as pSiCOH. A process such as CVD, ALD, or PVD can be used to deposit the ILD 902. Following deposition, the ILD 902 can be planarized using a process such as CMP.

Figure 10A:
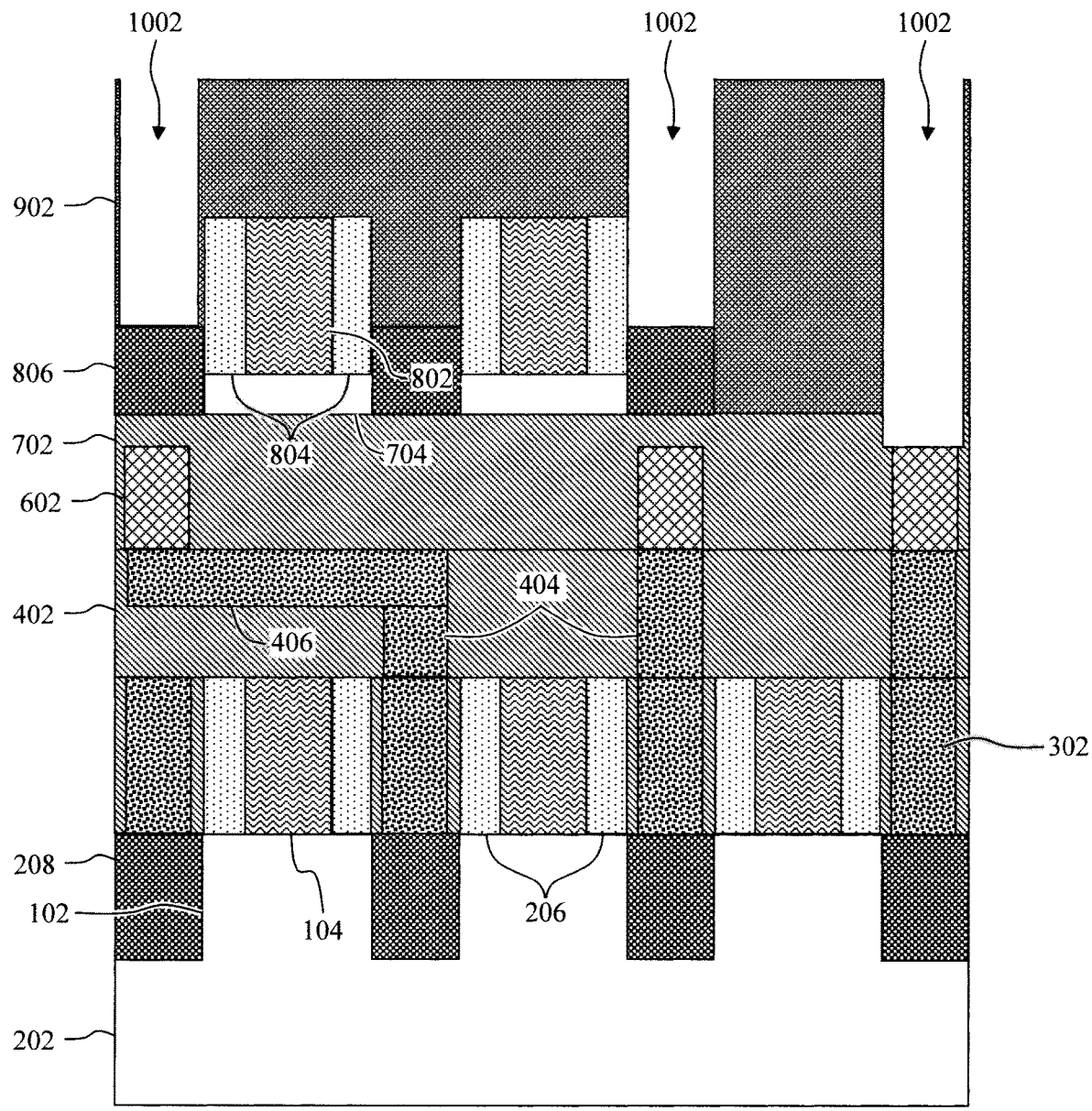
FIG. 10A is an X-X' cross-sectional view illustrating vias having been patterned in the third/fourth ILD over the sacrificial contacts.
Figure 10B:
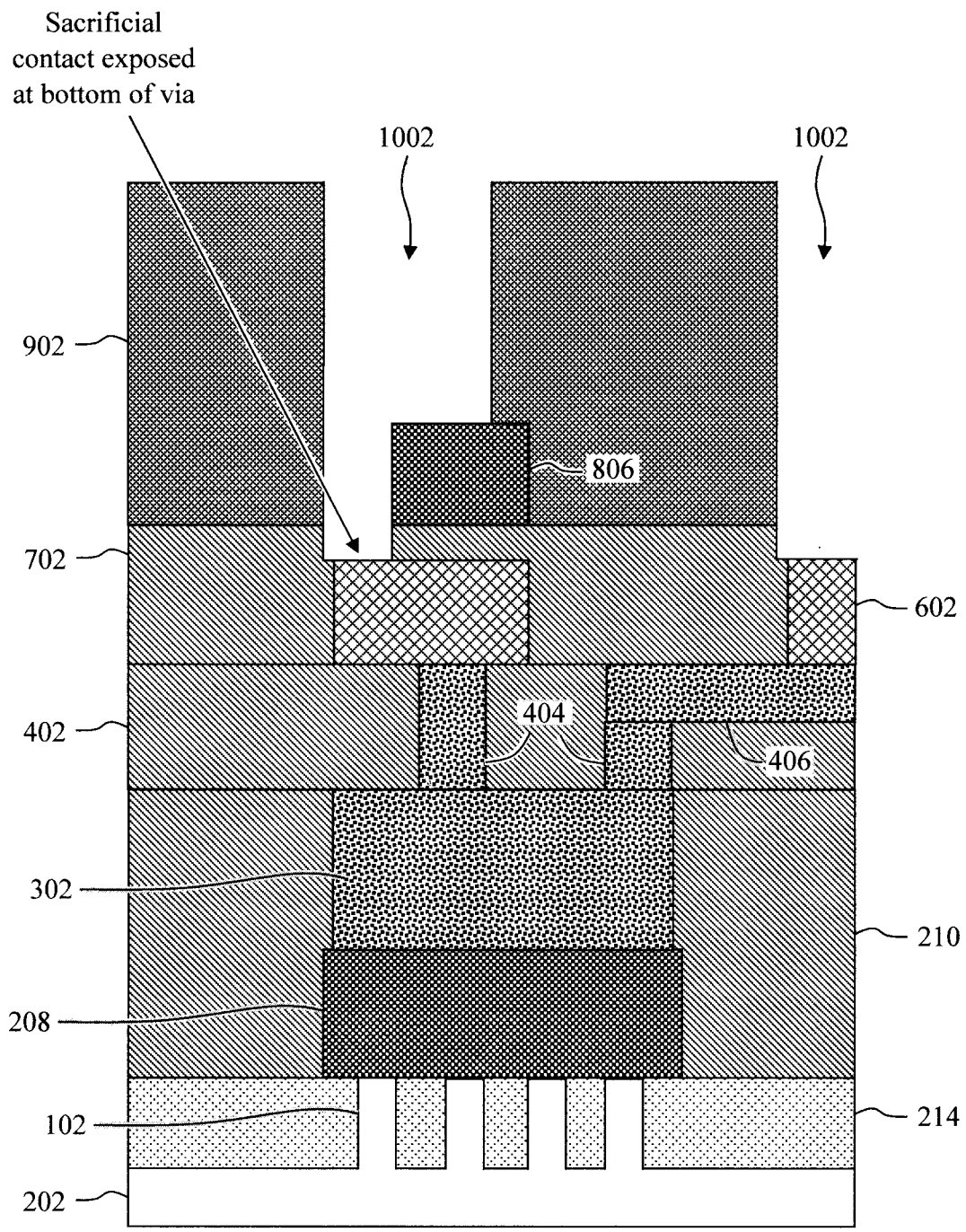
FIG. 10B is a Y-Y' cross-sectional view illustrating the vias having been patterned in the third/fourth ILD over the sacrificial contacts according to an embodiment of the present invention.

Standard lithography and etching techniques (see above) are then employed to pattern vias 1002 in the ILD 902 and ILD 702 over the sacrificial contacts 602. See FIG. 10A (an X-X' cross-sectional view) and FIG. 10B (a Y-Y' cross-sectional view). As highlighted above, some of the source/drain regions 806 are present over the sacrificial contacts 602, while other sacrificial contacts 602 optionally are not present under one of the source/drain regions 806. For the former, the vias 1002 extend through the ILD 902 down to the source/drain regions 806 present over the sacrificial contacts 602. For the latter, the vias 1002 extend through the ILD 902 down to the sacrificial contacts 602. See FIG. 10A. However, as shown in FIG. 10B, in order to form the present wrap-around source/drain contacts, at least a portion of the vias 1002 needs to extend down to the sacrificial contacts 602 such that at least a portion of the sacrificial contacts 602 are exposed at the bottom of the vias 1002. That way, the sacrificial contacts 602 can be accessed through the vias 1002 and selectively removed.

Figure 11A:
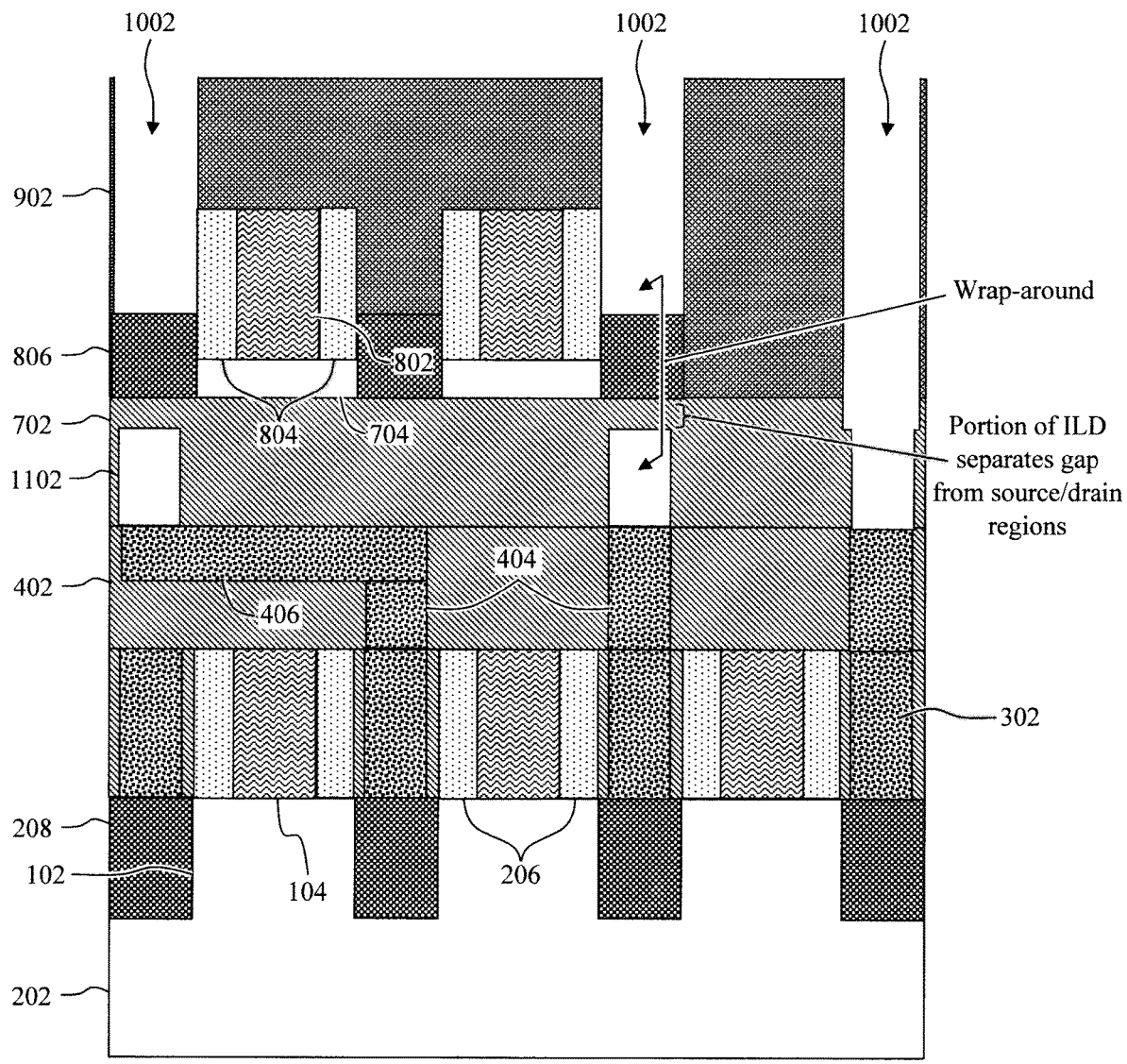
FIG. 11A is an X-X' cross-sectional view illustrating the sacrificial contacts having been selectively removed through the vias to form gaps that, along with the vias, at least partially wrap-around select source/drain regions of the top-level FET(s)
Figure 11B:
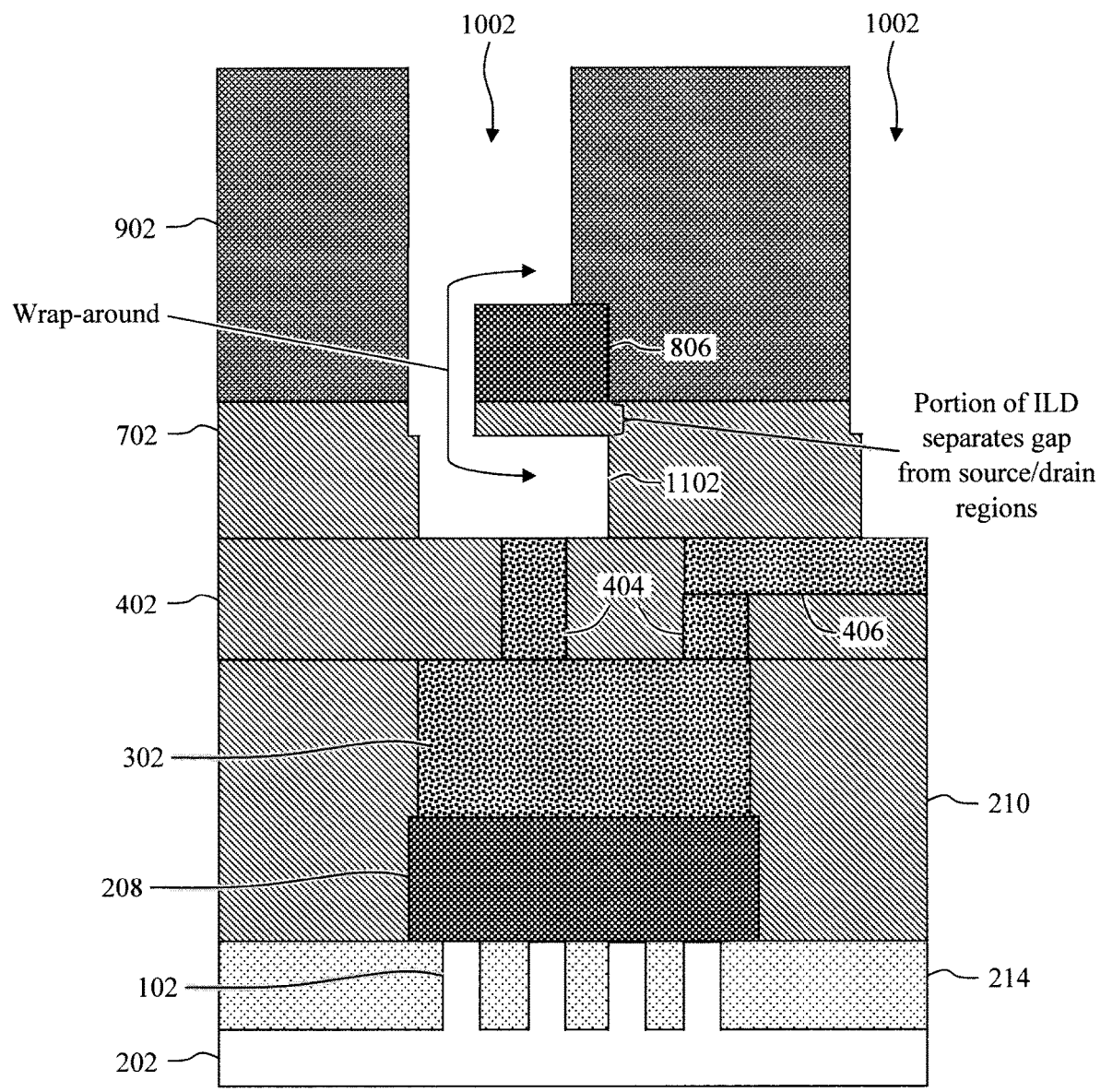
FIG. 11B is a Y-Y' cross-sectional view illustrating the sacrificial contacts having been selectively removed through the vias to form the gaps that, along with the vias, at least partially wrap-around select source/drain regions of the top-level FET(s) according to an embodiment of the present invention.

Namely, the sacrificial contacts 602 are then selectively removed through the vias 1002. See FIG. 11A (an X-X' cross-sectional view) and FIG. 11B (a Y-Y' cross-sectional view). By way of example only, as described above, the sacrificial contacts 602 can be formed from TiOx. In that case, a fluorine-containing and/or chlorine-containing plasma etch can be employed to selectively remove the TiOx sacrificial contacts 602 relative to ILD 402, ILD 702, etc. As shown in FIG. 11A and FIG. 11B, removal of the sacrificial contacts 602 provides gaps 1102 that, along with vias 1002, at least partially wrap-around select source/drain regions 806 of the top-level FET(s).

As shown in FIG. 11A and FIG. 11B, following removal of the sacrificial contacts 602 there are portions of the ILD 702 remaining between the gaps 1102 and the source/drain regions 806. While this remaining ILD 702 could prevent the wrap-around contacts from directly contacting a (bottom) surface of the source/drain regions 806, the wrap-around contacts will still have access to a majority of the exposed sidewall and top surfaces of the source/drain regions 806 (see below).

Figure 12A:
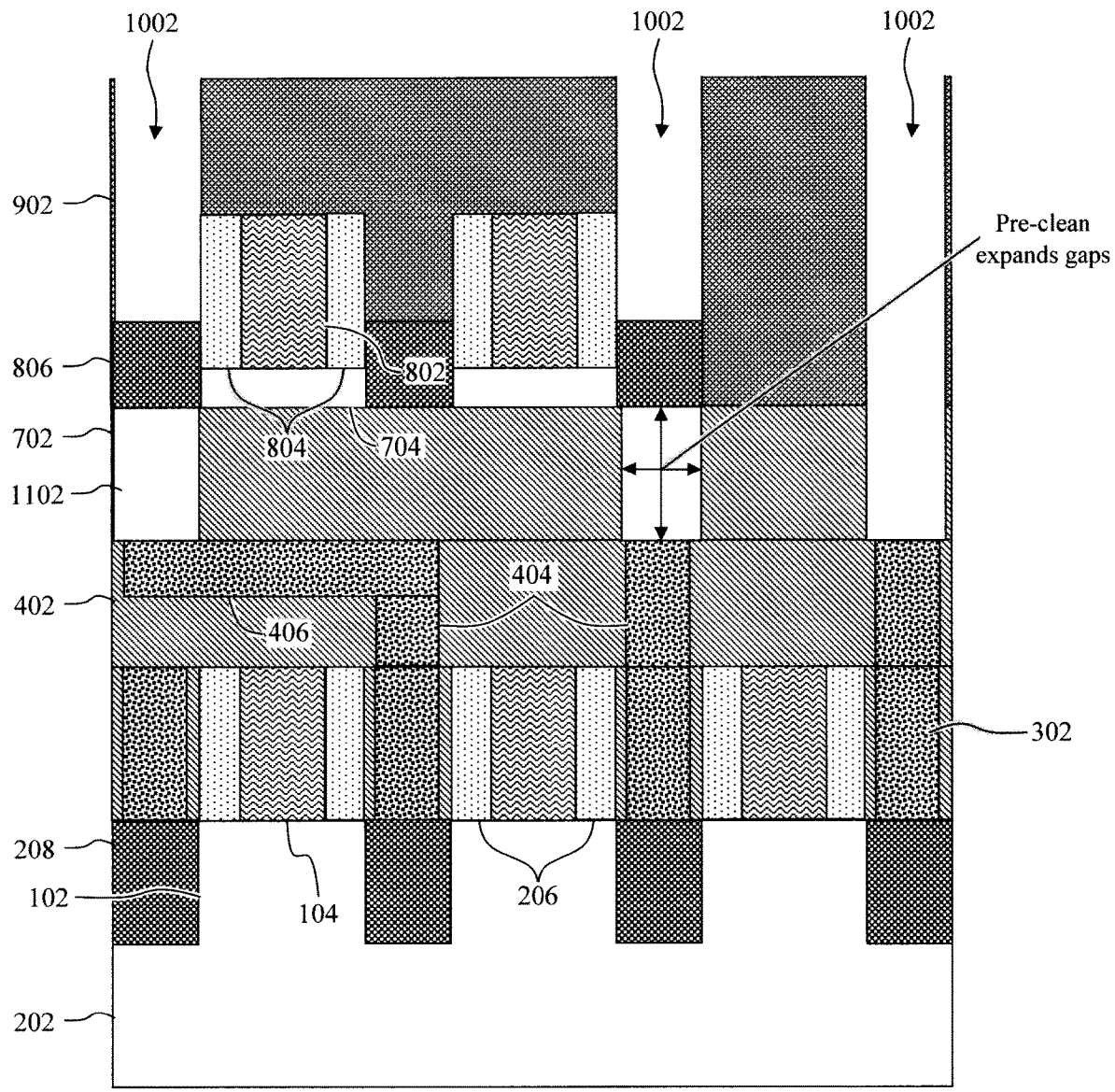
FIG. 12A is an X-X' cross-sectional view illustrating an optional pre-clean process having been performed that expands the gaps.
Figure 12B:
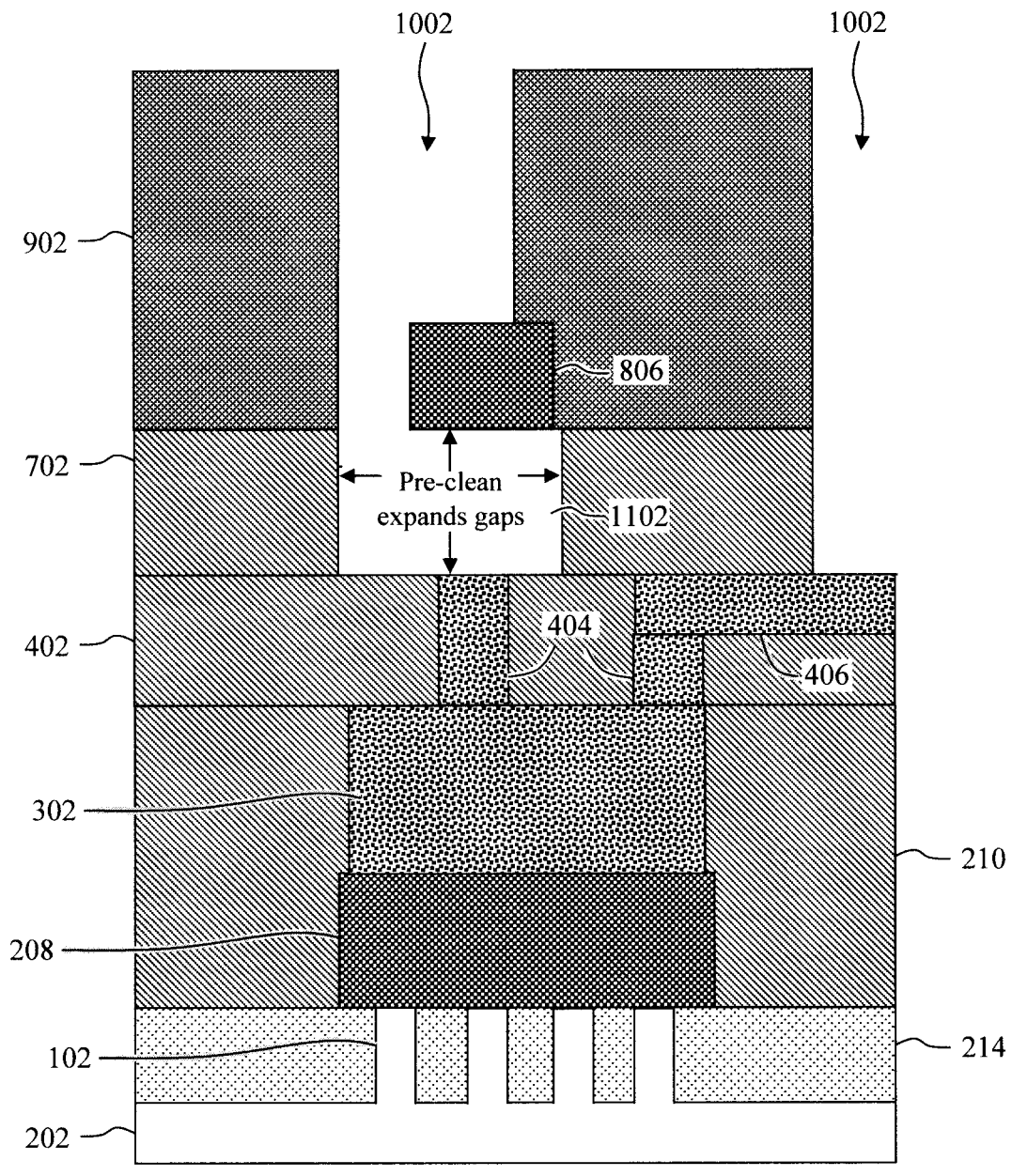
FIG. 12B is a Y-Y' cross-sectional view illustrating the optional pre-clean process having been performed that expands the gaps according to an embodiment of the present invention.

Nonetheless, it may be desirable to remove the ILD 702 separating the gaps 1102 and the source/drain regions 806 in order to optimize the contact area and contact resistance. Thus, an optional pre-clean process can next be performed. See FIG. 12A (an X-X' cross-sectional view) and FIG. 12B (a Y-Y' cross-sectional view). For instance, by way of example only, a standard Siconi® process can be employed to selectively remove oxides. As shown in FIG. 12A and FIG. 12B, performance of this pre-clean process expands the gaps 1102 ideally leaving little, if any, of the ILD 702 remaining between the gaps 1102 and the source/drain regions 806.

Figure 13A:
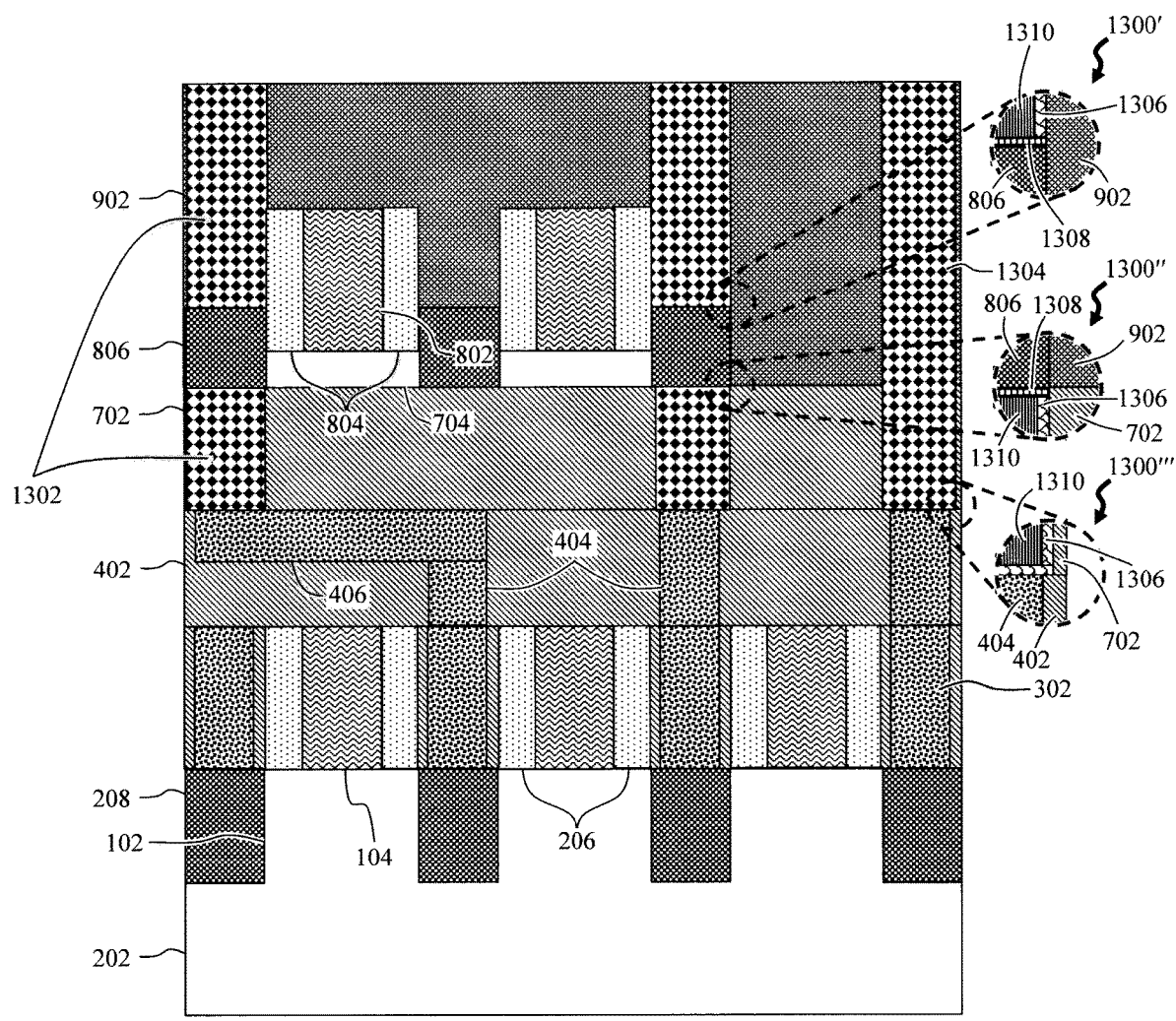
FIG. 13A is an X-X' cross-sectional view illustrating top-level FET source/drain contacts of the top-level FET(s) having been formed in the gaps and the vias that wrap-around the source/drain regions of the top-level FET(s) and directly contact a top, a bottom and at least one sidewall of the source/drain regions of the top-level FET(s), and upper contact vias having been formed in the other gaps and vias that connect directly to the lower contact vias.
Figure 13B:
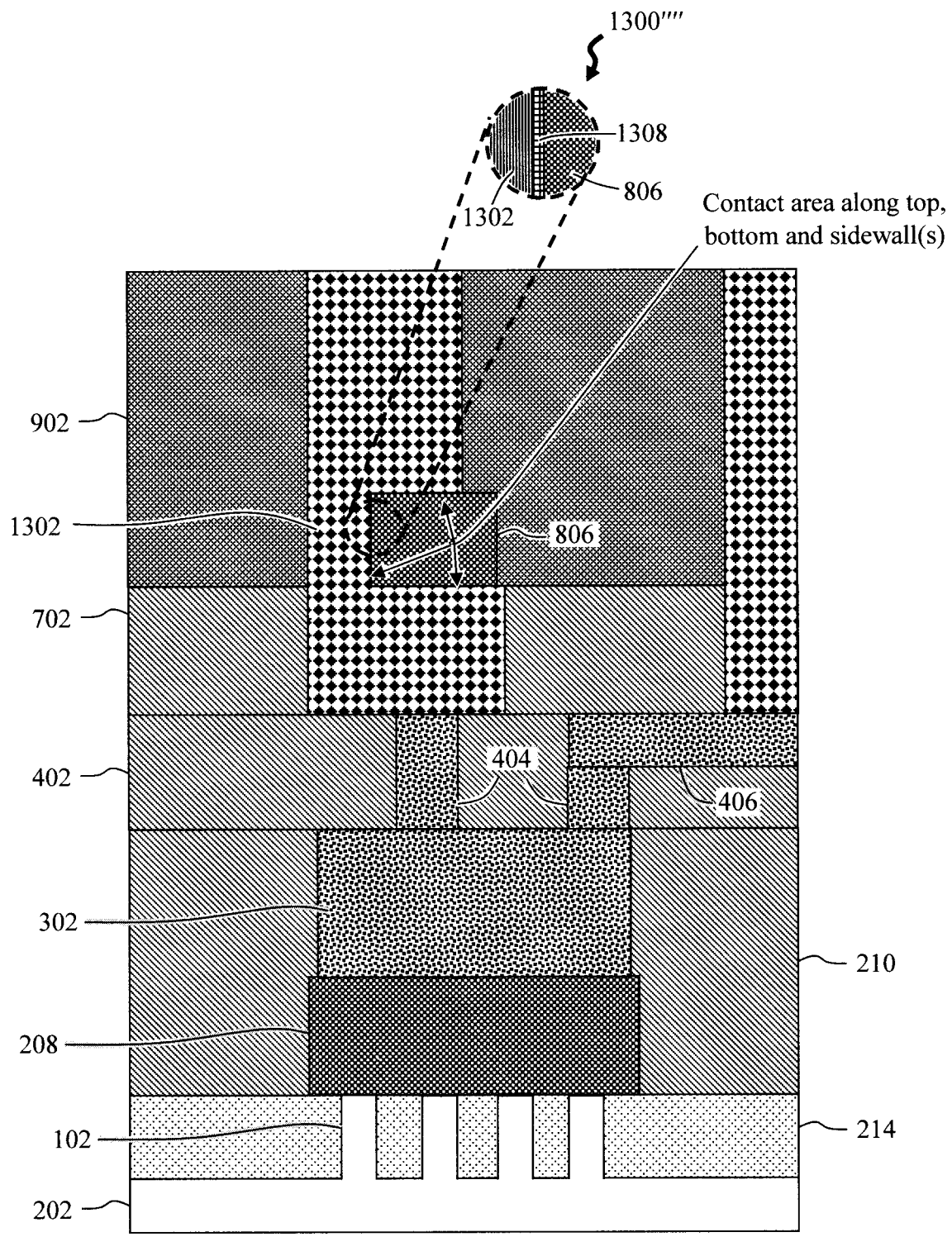
FIG. 13B is a Y-Y' cross-sectional view illustrating the top-level FET source/drain contacts of the top-level FET(s) having been formed in the gaps and the vias that wrap-around the source/drain regions of the top-level FET(s) and directly contact the top, the bottom and the at least one sidewall of the source/drain regions of the top-level FET(s)

Source/drain contacts 1302 of the top-level FET(s) (also referred to herein as "top-level FET source/drain contacts") are then formed in the gaps 1102 and vias 1002. See FIG. 13A (an X-X' cross-sectional view) and FIG. 13B (a Y-Y' cross-sectional view). As shown in FIG. 13A and FIG. 13B, the source/drain contacts 1302 at least partially wrap-around the source/drain regions 806 of the top-level FET(s). For instance, in the present exemplary embodiment, the source/drain contacts 1302 are in direct contact with a top and a bottom (see FIG. 13A) and at least one sidewall (see FIG. 13B) of the source/drain regions 806 of the top-level FET(s). As highlighted above, this wrap-around contact configuration increases the contact area and vastly reduces the contact resistance. It is notable that, even if some ILD 702 remains beneath the source/drain regions 806 (see above), the increased contact area along the top and sidewall(s) of the source/drain regions 806 vastly improves the contact resistance. This alternative configuration is described in conjunction with the description of FIG. 13C below.

As also shown in FIG. 13A and FIG. 13B, the source/drain contacts 1302 of the top-level FET(s) are either in direct contact with the underlying local interconnects 406 (in the case where the source/drain regions 208 of the bottom-level FET(s) and the source/drain regions 806 of the top-level FET(s) being connected are not aligned (i.e., unaligned) vertically, and hence the lower contact vias 404 and the source/drain contacts 1302 are not aligned vertically) or are in direct contact with the underlying lower contact vias 404 (in the case where the source/drain regions 208 of the bottom-level FET(s) and the source/drain regions 806 of the top-level FET(s) being connected are aligned vertically).

Any of the gaps 1102 not present under one of the source/drain regions 806, along with their corresponding vias 1002, are used to form upper contact vias 1304 that connect directly to the lower contact vias. See FIG. 13A and FIG. 13B. As shown in FIG. 13A and FIG. 13B, the upper contact vias 1304 are in direct contact with the underlying lower contact vias 404.

According to an exemplary embodiment, the source/drain contacts 1302 of the top-level FET(s) and upper contact vias 1304 are formed using a silicidation process whereby a liner 1306 is deposited into and lining the vias 1002 and gaps 1102. See magnified views 1300', 1300'', 1300''', and 1300''''. Suitable materials for the liner include, but are not limited to, titanium (Ti), TiN, nickel (Ni) and/or nickel platinum (NiPt). A process such as CVD, ALD or PVD can be employed to deposit the liner 1306 into the vias 1002 and gaps 1102. A silicidation anneal is then performed to react the liner 1306 with the epitaxial material in the source/drain regions 806, forming a silicide 1308 wherever the liner 1306 contacts the source/drain regions 806 (see magnified views 1300', 1300'' and 1300''''). Everywhere else the liner 1306 remains unreacted, including along the sidewalls of the vias 1002 and gaps 1102 above/below the source/drain regions 806 (see magnified views 1300' and 1300''), and along the bottom and sidewalls of the vias 1002 and gaps 1102 not present over the source/drain regions 806 (see magnified views 1300'''). According to an exemplary embodiment, the silicidation anneal is performed at a temperature of from about 300° C. to about 850° C., and ranges therebetween.

Following silicidation, a low resistance fill metal 1310 is deposited into and filling the vias 1002 and gaps 1102 over the liner 1306 and silicide 1308 (where present). Suitable low resistance fill metals 1310 include, but are not limited to, Cu, Co, Ru and/or W. A process such as CVD, ALD, evaporation, sputtering or electrochemical plating can be employed to deposit the low resistance fill metal 1310 into the vias 1002 and gaps 1102. Following deposition, the overburden can be removed using a process such as CMP.

Figure 13C:
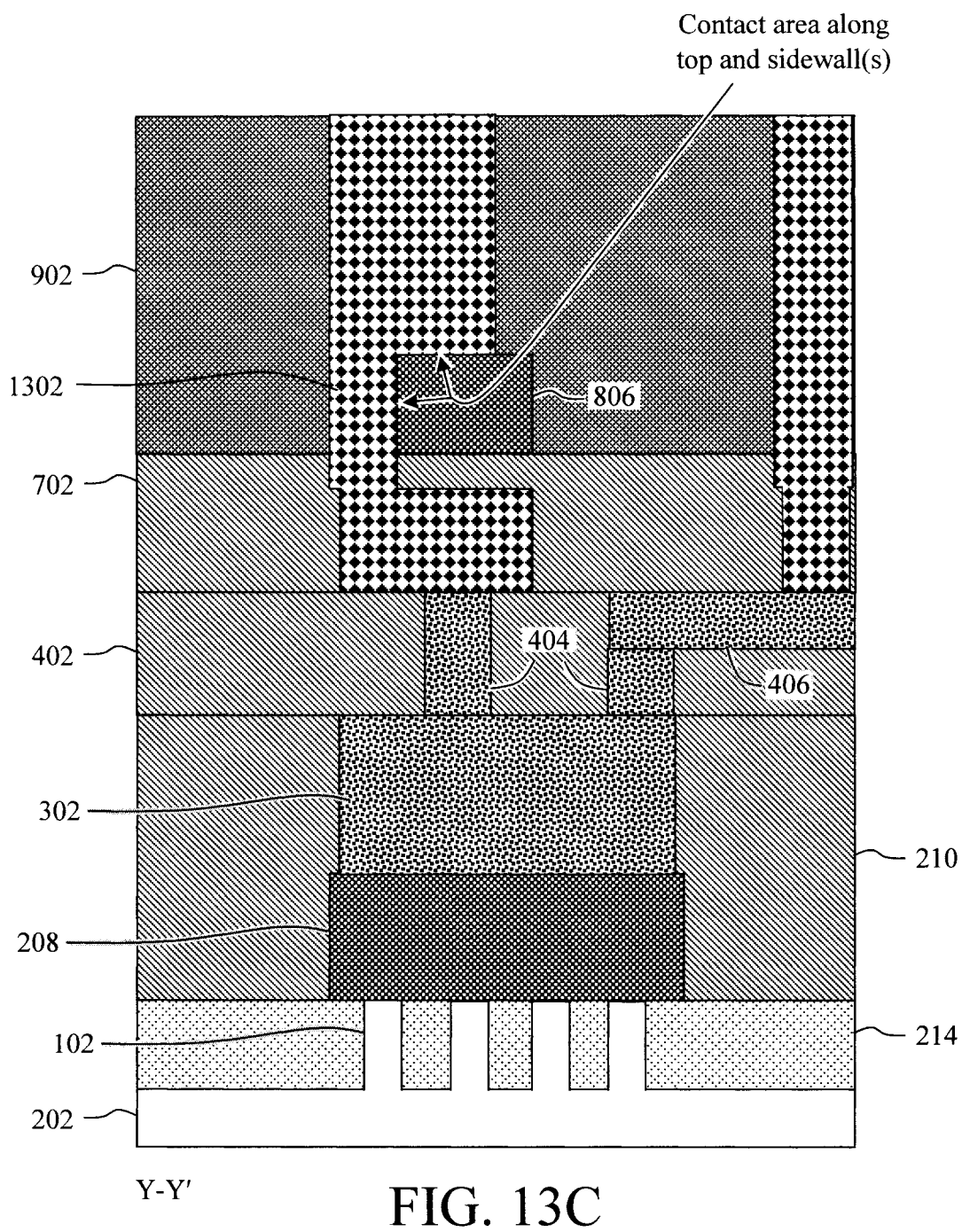
FIG. 13C is a Y-Y' cross-sectional view illustrating, according to an alternative embodiment where the pre-clean process has not been performed, the top-level FET source/drain contacts of the top-level FET(s) having been formed in the gaps and the vias that wrap-around the source/drain regions of the top-level FET(s) and directly contact a top and at least one sidewall of the source/drain regions of the top-level FET(s) according to an embodiment of the present invention.

As highlighted above, depending on whether the optional pre-clean is performed, it is possible that some ILD 702 remains beneath the source/drain regions 806. In that case, when the source/drain contacts 1302 are formed, as described above, there can be some ILD 702 separating the source/drain contacts 1302 from the bottom of the source/drain regions 806. This alternative configuration is shown illustrated in FIG. 13C. Namely, as shown in FIG. 13C, a sliver of the ILD 702 is present between the source/drain contacts 1302 and the bottom of the source/drain regions 806. Nonetheless, with the present wrap-around contact design, there is still an increased amount of contact area along the top and at least one sidewall of the source/drain regions 806 which vastly improves the contact resistance, i.e., as compared to conventional approaches where contact is made solely from the top of the source/drain.

In the figures that follow, it will be assumed that the optional pre-clean step has been performed, and that the source/drain contacts 1302 directly contact a top, a bottom and at least one side of the source/drain regions 806 of the top-level FET(s). However, the alternative configuration shown in FIG. 13C is also contemplated herein. It is notable that the remaining steps of the process are performed in the same manner with either of these structures.

The source/drain contacts 1302 and the upper contact vias 1304 are then recessed, and an ILD 1402 is deposited over the (recessed) source/drain contacts 1302 and upper contact vias 1304. See FIG. 14A (an X-X' cross-sectional view) and FIG. 14B (a Y-Y' cross-sectional view). By way of example only, a dry etch process selective for etching contact metal relative to oxide dielectrics is employed. The term 'fifth' may also be used herein when referring to ILD 1402 so as to distinguish it from the 'first' ILD 210, the 'second' ILD 402, the 'third' ILD 702, and the 'fourth' ILD 902. Suitable ILD 1402 materials include, but are not limited to, oxide materials such as SiOx and/or SiCOH, and/or ULK-ILD materials such as pSiCOH. A process such as CVD, ALD, or PVD can be used to deposit the ILD 1402. Following deposition, the ILD 1402 can be planarized using a process such as CMP.

Figure 14A:
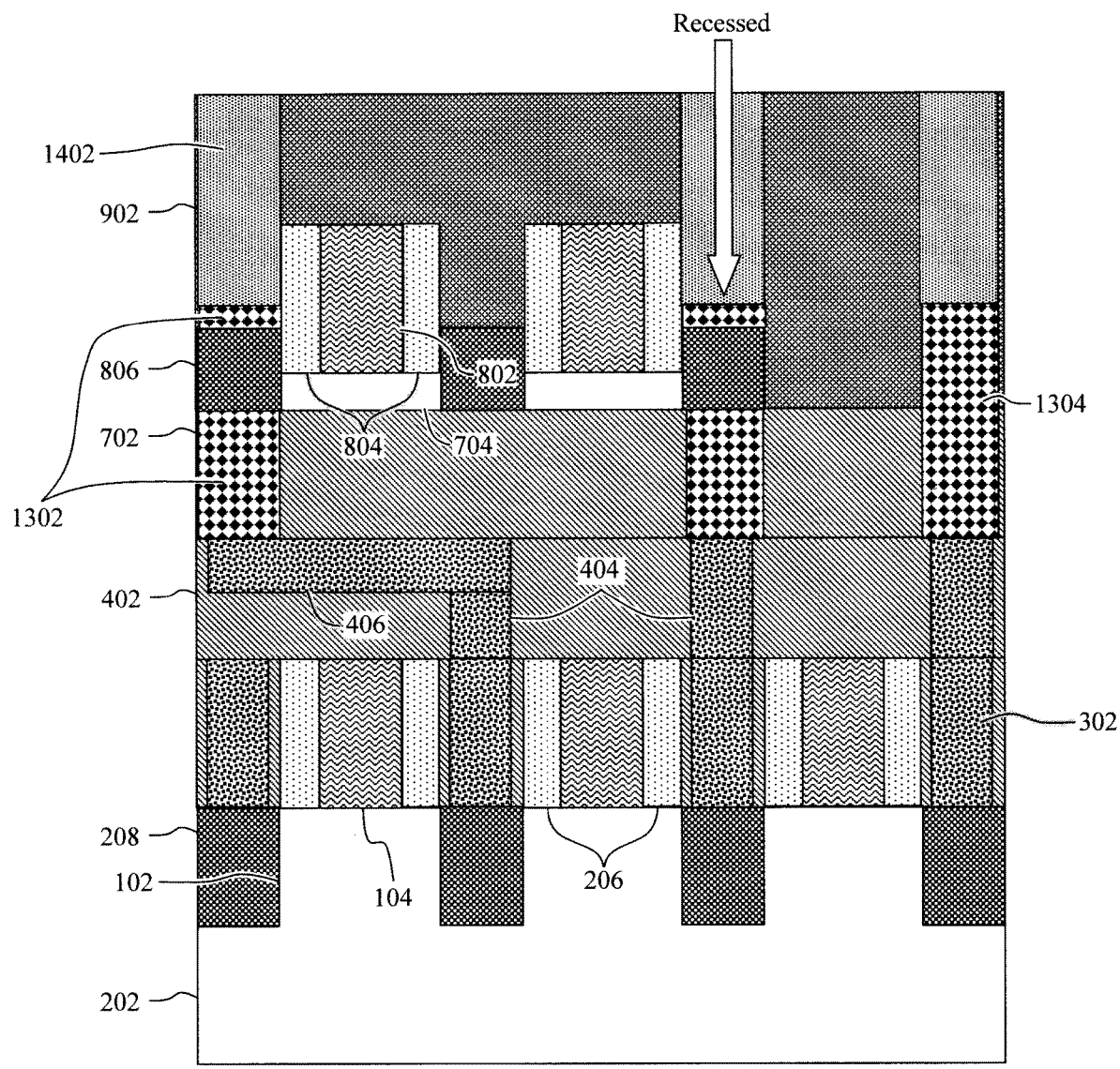
FIG. 14A is an X-X' cross-sectional view illustrating the source/drain contacts and the upper contact vias having been recessed, and a (fifth) ILD having been deposited over the (recessed) source/drain contacts and the (recessed) upper contact vias.
Figure 14B:
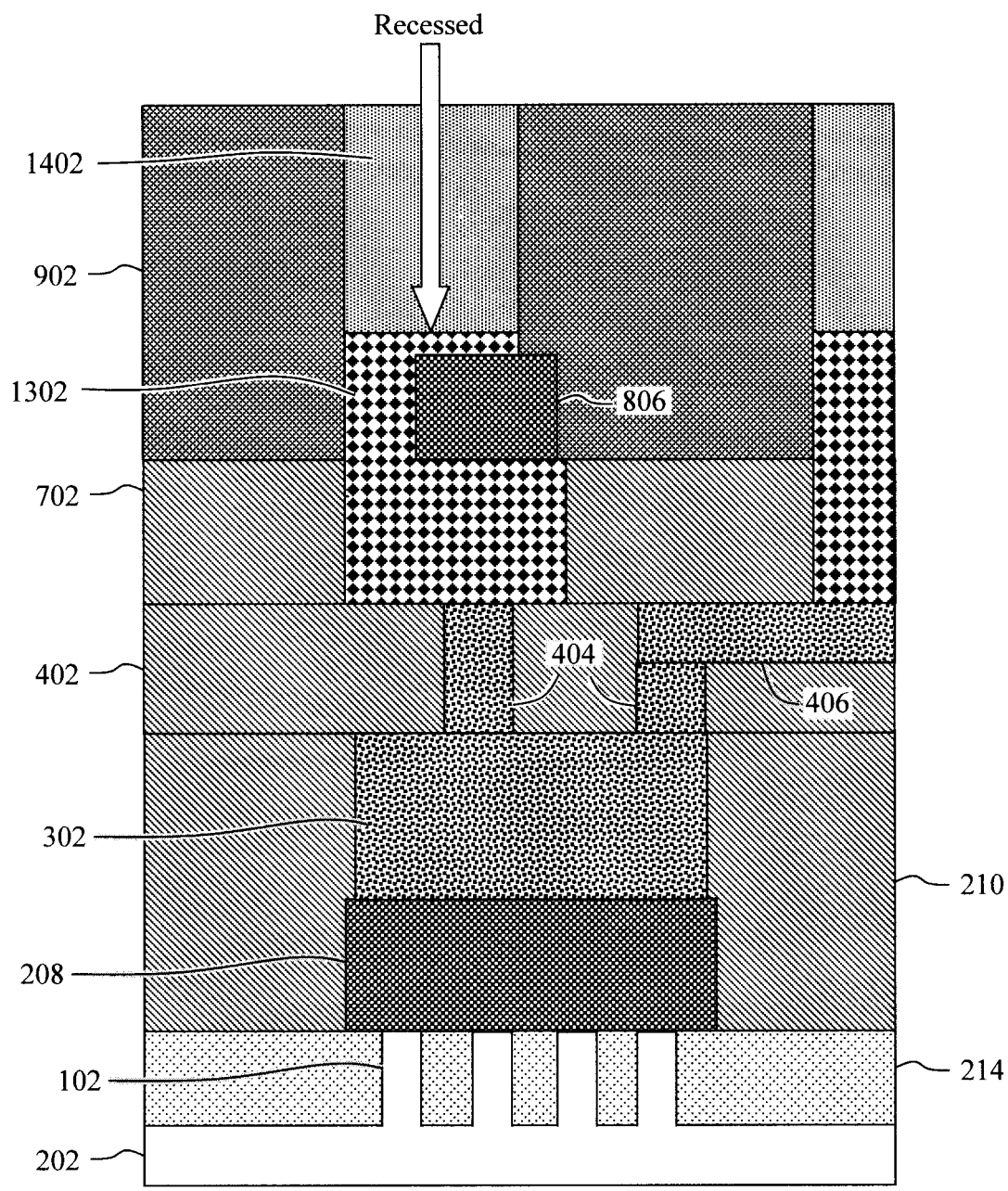
FIG. 14B is a Y-Y' cross-sectional view illustrating the source/drain contacts having been recessed, and the fifth ILD having been deposited over the (recessed) source/drain contacts and the (recessed) upper contact vias according to an embodiment of the present invention.
Figure 15A:
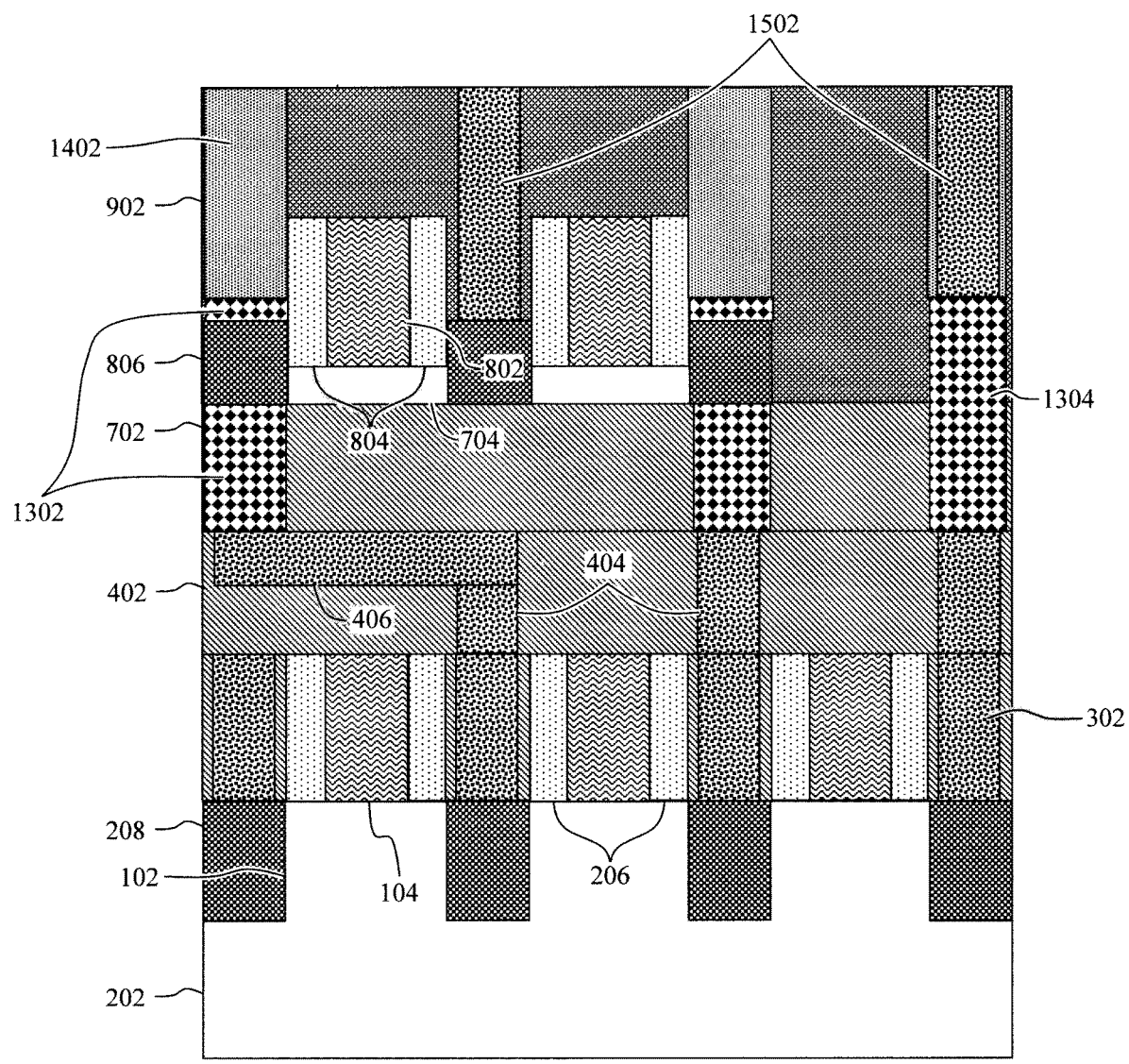
FIG. 15A is an X-X' cross-sectional view illustrating top contacts having been formed that directly contact at least one of the source/drain regions of the top-level FET(s) and/or the upper contact vias.
Figure 15B:
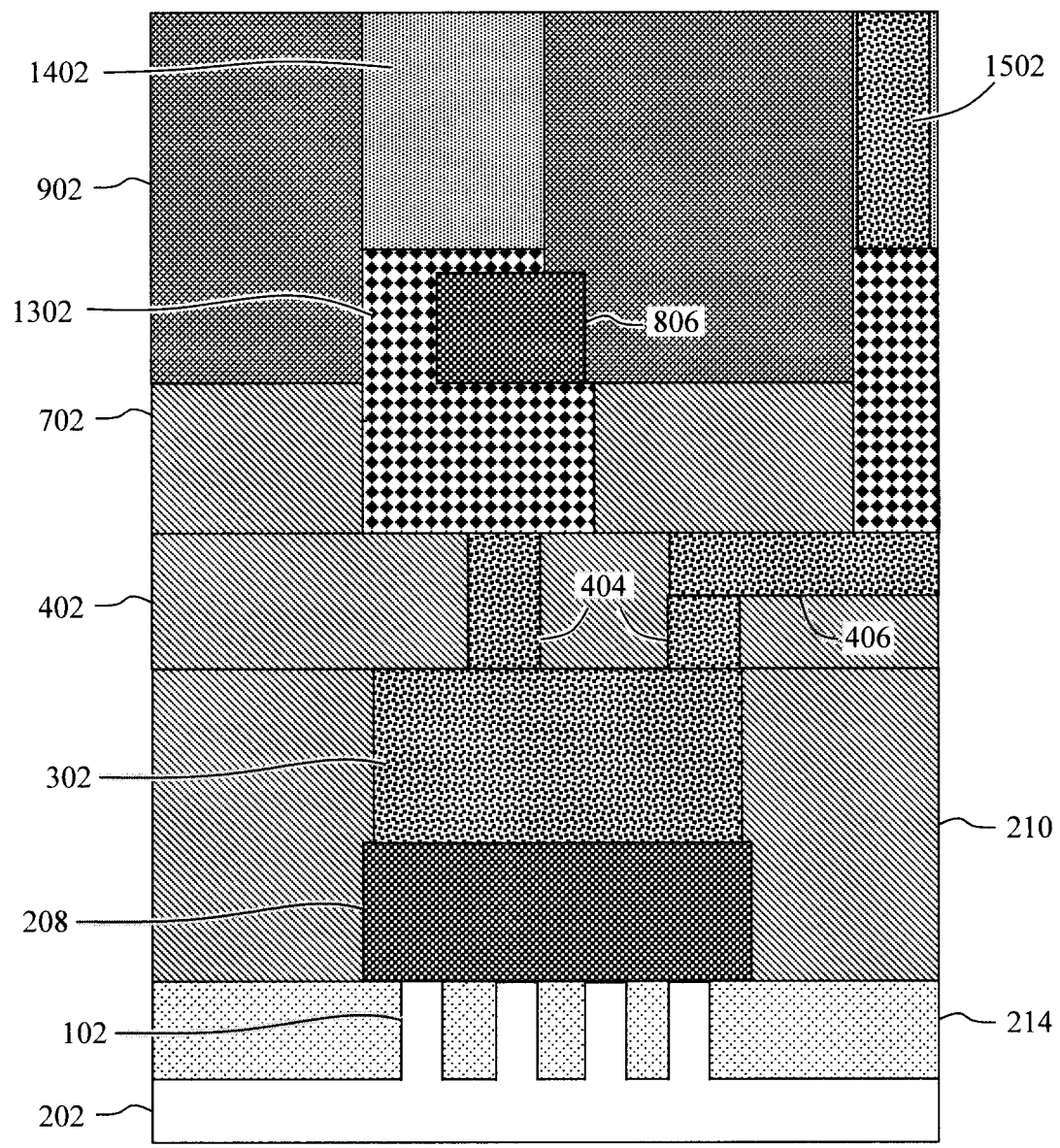
FIG. 15B is a Y-Y' cross-sectional view illustrating the top contacts having been formed that directly contact at least one of the source/drain regions of the top-level FET(s) and/or the upper contact vias according to an embodiment of the present invention.

As shown in FIG. 14A and FIG. 14B, according to an exemplary embodiment the source/drain contacts 1302 and the upper contact vias 1304 are recessed below the gates 802 and gate spacers 804 of the top-level FET(s). Namely, the top surfaces of both the source/drain contacts 1302 and the upper contact vias 1304 are now below a top surface of the gates 802 and gate spacers 804 of the top-level FET(s).

Standard metallization processes are then employed to form top contacts 1502 in the ILD 902/ILD 1402. See FIG. 15A (an X-X' cross-sectional view) and FIG. 15B (a Y-Y' cross-sectional view). According to an exemplary embodiment, at least one of the top contacts 1502 directly contacts at least one of the source/drain regions 806 of the top-level FET(s). Notably, the (wrap-around) source/drain contacts 1302 access the source/drain regions 806 from the bottom of the top-level FET(s), while the top contacts 1502 access other source/drain regions 806 of the top-level FET(s) from the top.

At least another one of the top contacts 1502 directly contacts the upper contact vias 1304. As described above, the upper contact vias 1304 are in direct contact with the underlying lower contact vias 404. In turn, the lower contact vias 404 directly contact the underlying source/drain contacts 302 of the bottom-level FET(s) over the source/drain regions 208.

To form the top contacts 1502, standard lithography and etching techniques (see above) are first used to pattern features such as vias in the ILD 902/ILD 1402. The features (i.e., vias) are then filled with a metal or a combination of metals to form the top contacts 1502. As provided above, suitable metals include, but are not limited to, Cu, W, Ru, Co, Ni and/or Pt. The contact metal(s) can be deposited into the vias using a process such as evaporation, sputtering, or electrochemical plating. Following deposition, the metal overburden can be removed using a process such as CMP. Prior to depositing the metal(s), a barrier layer (not shown) can be deposited into and lining the vias. Use of such a barrier layer helps to prevent diffusion of the metal(s) into the surrounding ILD 902. Suitable barrier layer materials include, but are not limited to, Ta, TaN, Ti and/or TiN. Additionally, a seed layer (not shown) can be deposited into and lining the vias prior to metal deposition, i.e., to facilitate plating of the metal into the vias.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A stacked field-effect transistor (FET) device, comprising:
   at least one bottom-level FET on a substrate;
   lower contact vias present in an interlayer dielectric (ILD) disposed over the at least one bottom-level FET;
   at least one top-level FET present over the lower contact vias; and
   top-level FET source/drain contacts that wrap-around source/drain regions of the at least one top-level FET, wherein the lower contact vias connect the top-level FET source/drain contacts to source/drain regions of the at least one bottom-level FET.

2. The stacked FET device of claim 1, wherein the top-level FET source/drain contacts are in direct contact with a top and at least one sidewall of the source/drain regions of the at least one top-level FET.

3. The stacked FET device of claim 1, wherein the top-level FET source/drain contacts are in direct contact with a top, a bottom and at least one sidewall of the source/drain regions of the at least one top-level FET.

4. The stacked FET device of claim 1, wherein the lower contact vias connect to the top-level FET source/drain contacts from a bottom of the at least one top-level FET.

5. The stacked FET device of claim 1, wherein a given one of the lower contact vias and a given one of the top-level FET source/drain contacts to which the given lower contact via is connected are unaligned vertically.

6. The stacked FET device of claim 5, further comprising:
   a local interconnect between the given lower contact via and the given top-level FET source/drain contact.

7. The stacked FET device of claim 1, further comprising:
   bottom-level FET source/drain contacts disposed over the source/drain regions of the at least one bottom-level FET.

8. The stacked FET device of claim 7, wherein the lower contact vias are in direct contact with the bottom-level FET source/drain contacts.

9. The stacked FET device of claim 1, further comprising:
   gates of the at least one top-level FET that are offset from the source/drain regions of the at least one top-level FET by gate spacers, wherein a top surface of the top-level FET source/drain contacts is below a top surface of the gates.

10. The stacked FET device of claim 1, further comprising:
    at least one upper contact via in direct contact with at least one of the lower contact vias.

11. A stacked FET device, comprising:
    at least one bottom-level FET on a substrate;
    lower contact vias and local interconnects present in an ILD disposed over the at least one bottom-level FET;
    at least one top-level FET present over the lower contact vias;
    top-level FET source/drain contacts that wrap-around source/drain regions of the at least one top-level FET,
    wherein the lower contact vias connect the top-level FET source/drain contacts to source/drain regions of the at least one bottom-level FET, wherein each of the local interconnects connects a given one of the lower contact vias to a given one of the top-level FET source/drain contacts, and wherein each of the top-level FET source/drain contacts is in direct contact with either one of the local interconnects or one of the lower contact vias from a bottom of the at least one top-level FET.

12. The stacked FET device of claim 11, wherein the top-level FET source/drain contacts are in direct contact with a top and at least one sidewall of the source/drain regions of the at least one top-level FET.

13. The stacked FET device of claim 11, wherein the top-level FET source/drain contacts are in direct contact with a top, a bottom and at least one sidewall of the source/drain regions of the at least one top-level FET.

14. The stacked FET device of claim 11, further comprising:
    bottom-level FET source/drain contacts disposed over the source/drain regions of the at least one bottom-level FET, wherein the lower contact vias are in direct contact with the bottom-level FET source/drain contacts.

* * * * *